(12) United States Patent
Lee et al.

(10) Patent No.: US 11,569,128 B2
(45) Date of Patent: Jan. 31, 2023

(54) SEMICONDUCTOR DEVICE

(71) Applicant: SAMSUNG ELECTRONICS CO., LTD., Suwon-si (KR)

(72) Inventors: Woojin Lee, Hwaseong-si (KR); Hoon Seok Seo, Suwon-si (KR); Sanghoon Ahn, Hwaseong-si (KR); Kyu-Hee Han, Hwaseong-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 93 days.

(21) Appl. No.: 17/174,409

(22) Filed: Feb. 12, 2021

(65) Prior Publication Data

US 2021/0166974 A1 Jun. 3, 2021

Related U.S. Application Data

(63) Continuation of application No. 16/411,439, filed on May 14, 2019, now Pat. No. 10,943,824.

(30) Foreign Application Priority Data

Sep. 20, 2018 (KR) .................. 10-2018-0113152

(51) Int. Cl.
*H01L 23/528* (2006.01)
*H01L 21/768* (2006.01)

(52) U.S. Cl.
CPC .... *H01L 21/76897* (2013.01); *H01L 21/7682* (2013.01); *H01L 21/76834* (2013.01); *H01L 21/76843* (2013.01); *H01L 21/76883* (2013.01); *H01L 21/76885* (2013.01); *H01L 23/5283* (2013.01)

(58) Field of Classification Search
CPC ....... H01L 21/76834; H01L 21/76843–76849; H01L 21/76883; H01L 21/76897; H01L 23/5283

See application file for complete search history.

(56) References Cited

U.S. PATENT DOCUMENTS

| | | |
|---|---|---|
| 6,551,924 B1 | 4/2003 | Dalton et al. |
| 6,753,258 B1 | 6/2004 | Gaillard et al. |
| 7,601,607 B2 | 10/2009 | Liu et al. |
| 7,830,010 B2 | 11/2010 | Yang et al. |
| 9,059,257 B2 | 6/2015 | Li et al. |

(Continued)

FOREIGN PATENT DOCUMENTS

| | | |
|---|---|---|
| JP | 2003-100869 A | 4/2003 |
| JP | 2013-089831 A | 5/2013 |
| KR | 10-2016-0067349 A | 6/2016 |

*Primary Examiner* — Daniel P Shook
(74) *Attorney, Agent, or Firm* — Lee IP Law, P.C.

(57) ABSTRACT

A semiconductor device includes a substrate including an active pattern, a first interlayer dielectric layer on the substrate, the first interlayer dielectric layer including a recess on an upper portion thereof, and a lower connection line in the first interlayer dielectric layer, the lower connection line being electrically connected to the active pattern, and the lower connection line including a conductive pattern, the recess of the first interlayer dielectric layer selectively exposing a top surface of the conductive pattern, and a barrier pattern between the conductive pattern and the first interlayer dielectric layer, the first interlayer dielectric layer covering a top surface of the barrier pattern.

20 Claims, 27 Drawing Sheets

(56) References Cited

U.S. PATENT DOCUMENTS

| | | |
|---|---|---|
| 9,520,321 B2 | 12/2016 | Ryan et al. |
| 9,553,017 B2 | 1/2017 | Zhang |
| 9,818,690 B2 | 11/2017 | Tsai et al. |
| 10,008,407 B2 | 6/2018 | Lee et al. |
| 2003/0057457 A1 | 3/2003 | Yamada et al. |
| 2017/0338241 A1 | 11/2017 | Lee |
| 2018/0358262 A1* | 12/2018 | Lu .................. H01L 21/76897 |
| 2019/0295891 A1 | 9/2019 | Clark et al. |
| 2020/0006131 A1 | 1/2020 | Shimabukuro et al. |

* cited by examiner

SEMICONDUCTOR DEVICE

CROSS-REFERENCE TO RELATED APPLICATION

This application is a continuation of U.S. patent application Ser. No. 16/411,439 filed May 14, 2019, which is incorporated by reference herein in its entirety.

Korean Patent Application No. 10-2018-0113152, filed on Sep. 20, 2018, in the Korean Intellectual Property Office, and entitled: "Semiconductor Device and Method of Manufacturing the Same," is incorporated by reference herein in its entirety.

BACKGROUND

1. Field

The present disclosure relates to a semiconductor device and a method of manufacturing the same, and more particularly, to a semiconductor device including connection lines on an integrated circuit of a substrate and a method of manufacturing the same.

2. Description of the Related Art

Semiconductor devices are widely used in the electronic industry because of their small size, multi-functionality, and/or low manufacturing cost. Semiconductor devices may encompass a memory device for storing data, a logic device for processing data, and a hybrid device for operating various functions contemporaneously or simultaneously.

The demand for semiconductor devices with high integration and high speed have been increasing with the advanced development of the electronic industry. However, it is increasingly difficult to manufacture highly integrated and/or semiconductor devices because of process margin reduction in an exposure process defining fine patterns. Various studies have been conducted to meet the requirements of high integration and/or high speed in semiconductor devices.

Further, in the semiconductor industry, high capacity, thinness, and small size of semiconductor devices and electronic products using the same have been required in various semiconductor package techniques. One approach of the various package techniques is a packaging technique which vertically stacks a plurality of semiconductor chips to achieve a high-density chip stacking. This packaging technique has an advantage capable of integrating semiconductor chips having various functions on a small area, as compared to a semiconductor package consisting of one semiconductor chip.

SUMMARY

According to some example embodiments, a semiconductor device may include a substrate having an active pattern, a first interlayer dielectric layer on the substrate, the first interlayer dielectric layer including a recess on an upper portion thereof, and a lower connection line in the first interlayer dielectric layer, the lower connection line being electrically connected to the active pattern, and the lower connection line including a conductive pattern, the recess of the first interlayer dielectric layer selectively exposing a top surface of the conductive pattern, and a barrier pattern between the conductive pattern and the first interlayer dielectric layer, the first interlayer dielectric layer covering a top surface of the barrier pattern.

According to some example embodiments, a semiconductor device may include a substrate, a first interlayer dielectric layer on the substrate, and a lower connection line in the first interlayer dielectric layer. The lower connection line may include a conductive pattern, and a barrier pattern that is between the conductive pattern and the first interlayer dielectric layer. The first interlayer dielectric layer may include a recess exposing a top surface of the conductive pattern, and a part adjacent to the recess and on a top surface of the barrier pattern.

According to some example embodiments, a semiconductor device may include a substrate having an active pattern, a first interlayer dielectric layer on a substrate, a lower connection line in the first interlayer dielectric layer and electrically connected to the active pattern, and a liner between the first interlayer dielectric layer and the lower connection line. A top surface of the liner may be located at a level higher than that of a top surface of the lower connection line. The top surface of the liner may be coplanar with a top surface of the first interlayer dielectric layer.

According to some example embodiments, a method of manufacturing a semiconductor device may include forming a sacrificial layer on a substrate, forming a lower connection line in the sacrificial layer, selectively forming a capping pattern on a top surface of the lower connection line, replacing the sacrificial layer with a first interlayer dielectric layer, and selectively removing the capping pattern to form a recess that exposes the top surface of the lower connection line.

BRIEF DESCRIPTION OF THE DRAWINGS

Features will become apparent to those of skill in the art by describing in detail exemplary embodiments with reference to the attached drawings, in which.

DETAILED DESCRIPTION

Figure 1:
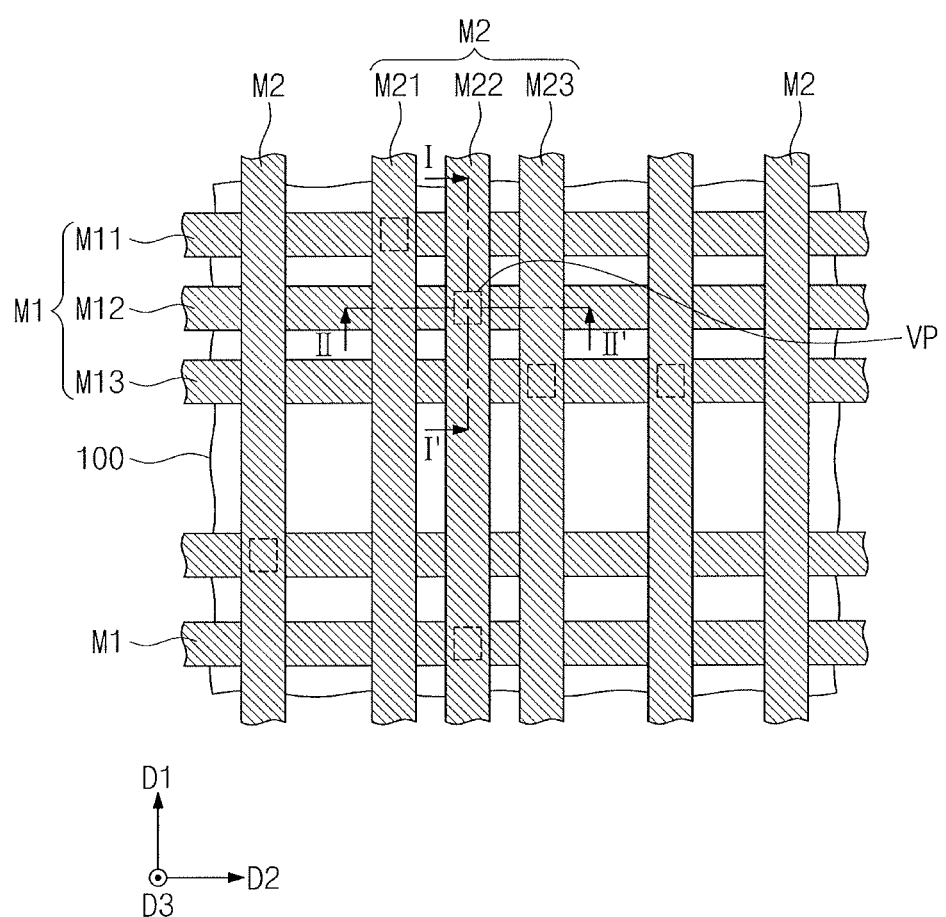
FIG. 1 illustrates a plan view of a semiconductor device according to some example embodiments.
Figure 2A:
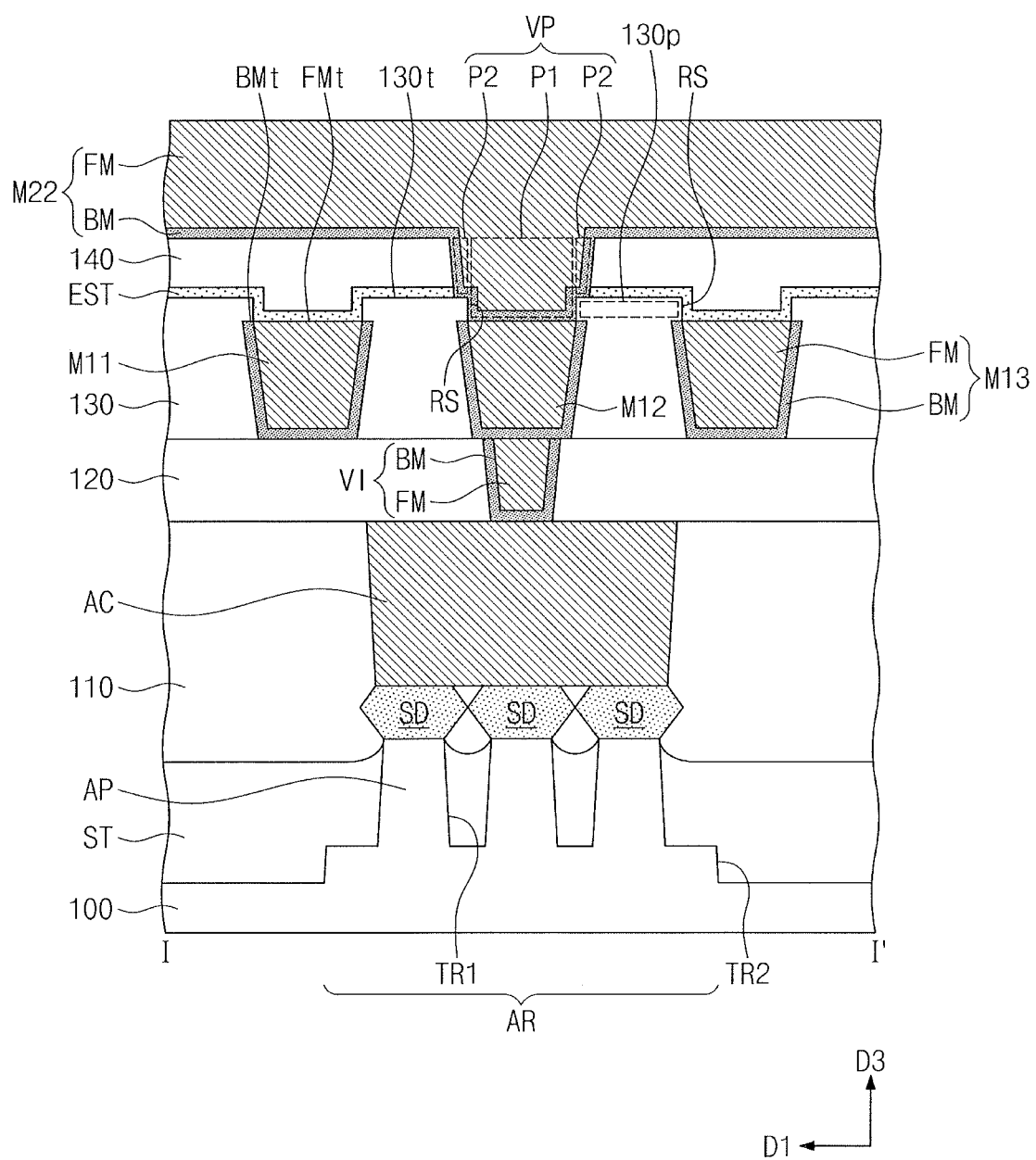
FIGS. 2A and 2B illustrate cross-sectional views along lines I-I' and II-II' of FIG. 1, respectively.
Figure 2B:
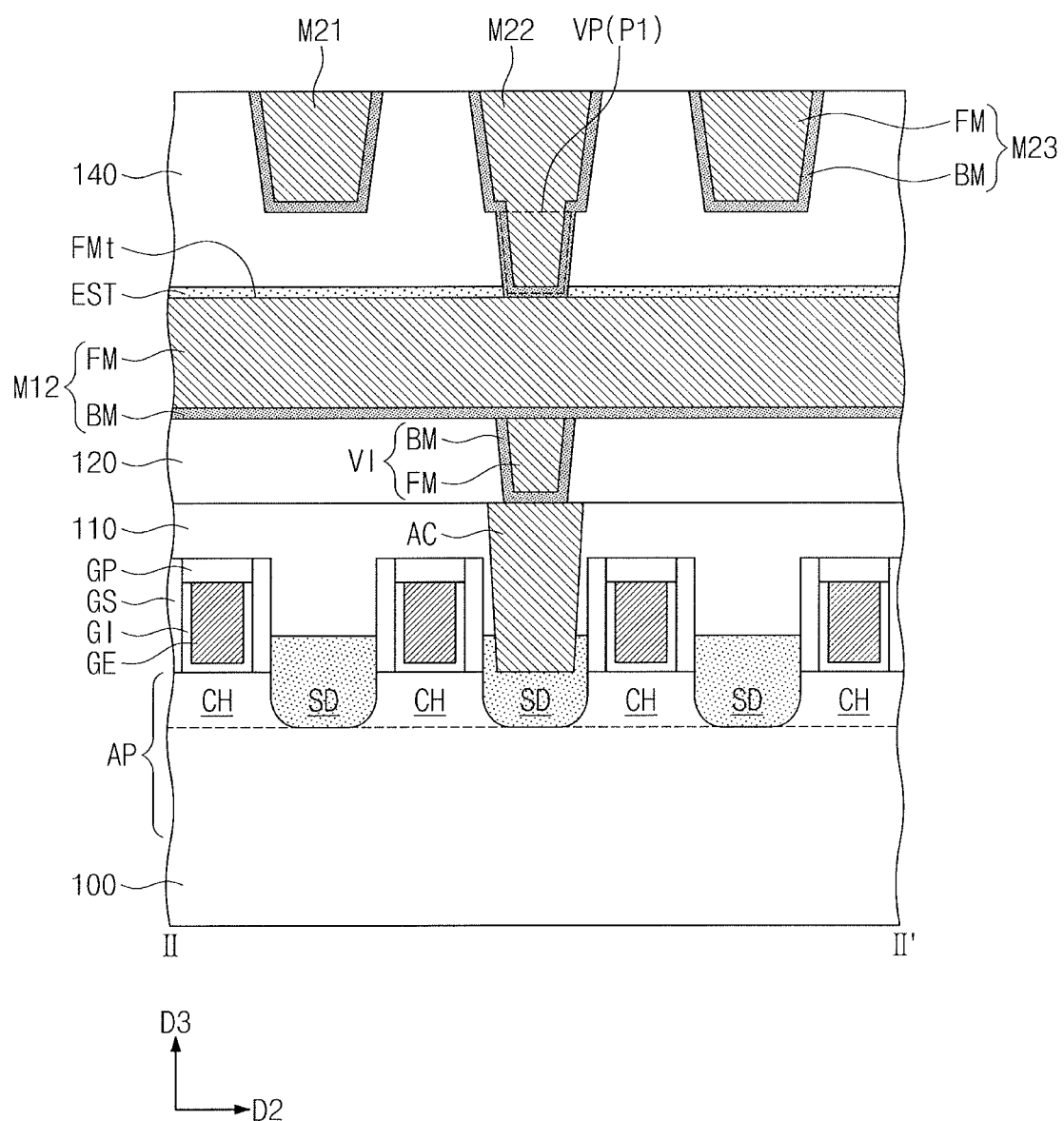

FIG. 1 illustrates a plan view showing a semiconductor device according to some example embodiments. FIGS. 2A and 2B illustrate cross-sectional views respectively taken along lines I-I' and II-II' of FIG. 1.

Referring to FIGS. 1, 2A, and 2B, a substrate 100 may include an active region AR. The active region AR may be defined by a second trench TR2 formed on an upper portion of the substrate 100. The substrate 100 may be a compound semiconductor substrate or a semiconductor substrate including, e.g., silicon, germanium, silicon-germanium, or the like. For example, the substrate 100 may be a silicon substrate.

The active region AR may be a logic cell area provided with logic transistors constituting a logic circuit of a semiconductor device. Alternatively, the active region AR may be a memory cell area to store data.

As illustrated in FIG. 2A, the active region AR may be provided thereon with a plurality of active patterns AP extending in a second direction D2, and spaced apart from each other in a first direction D1. The active patterns AP may be vertically protruding portions of the substrate 100. A first trench TR1 may be defined between neighboring active patterns AP.

A device isolation layer ST may fill the first and second trenches TR1 and TR2. The device isolation layer ST may include a dielectric material, e.g., a silicon oxide layer. The active patterns AP may have their upper portions that vertically protrude beyond, e.g., above, the device isolation layer ST. Each of the upper portions of the active patterns AP may have a fin shape. The device isolation layer ST may not cover the upper portions of the active patterns AP. The device isolation layer ST may cover lower sidewalls of the active patterns AP.

Source/drain patterns SD may be provided on the upper portions of the active patterns AP. The source/drain patterns SD may be impurity regions having a first conductive type (e.g., p type) or a second conductive type (e.g., n type). As illustrated in FIG. 2B, a channel region CH may be interposed between a pair of the source/drain patterns SD within a same active pattern AP.

The source/drain patterns SD may be epitaxial patterns formed by a selective epitaxial growth process. The source/drain patterns SD may have their top surfaces at a higher level than that of top surfaces of the channel regions CH, e.g., along a third direction D3. For example, the source/drain patterns SD may include a semiconductor element (e.g., SiGe) whose lattice constant is greater than that of a semiconductor element of the substrate 100. In another example, the source/drain patterns SD may include the same semiconductor element (e.g., Si) as that of the substrate 100.

Gate electrodes GE may be provided to extend in the first direction D1, while running across the active patterns AP. The gate electrodes GE may be spaced apart from each other in the second direction D2. The gate electrodes GE may vertically overlap the channel regions CH. The gate electrodes GE may include, for example, one or more of conductive metal nitride (e.g., titanium nitride or tantalum nitride) and metal (e.g., titanium, tantalum, tungsten, copper, or aluminum).

A pair of gate spacers GS may be on opposite sidewalls of each of the gate electrodes GE. The gate spacers GS may extend in the first direction D1 along the gate electrodes GE. The gate spacers GS may include one or more of, e.g., SiCN, SiCON, and SiN.

Gate dielectric patterns GI may be interposed between corresponding gate electrodes GE and corresponding channel regions CH. The gate dielectric patterns GI may include a high-k dielectric material. Gate capping patterns GP may be provided on corresponding gate electrodes GE. For example, the gate capping patterns GP may include one or more of SiON, SiCN, SiCON, and SiN.

A first interlayer dielectric layer 110 may be provided on the substrate 100. The first interlayer dielectric layer 110 may cover the source/drain patterns SD, the gate spacers GS, and the gate capping patterns GP. The first interlayer dielectric layer 110 may include, e.g., a silicon oxide layer.

An active contact AC may penetrate the first interlayer dielectric layer 110 and to have electrical connection with the source/drain patterns SD. The active contact AC may be between a pair of the gate electrodes GE.

Second, third, and fourth interlayer dielectric layers 120, 130, and 140 may be sequentially stacked on the first interlayer dielectric layer 110 along the third direction D3. The second, third, and fourth interlayer dielectric layers 120, 130, and 140 may include, e.g., a silicon oxide layer.

A via VI may be provided in the second interlayer dielectric layer 120, e.g., a thickness of the via VI in the third direction D3 may equal that of the second interlayer dielectric layer 120. The via VI may penetrate the second interlayer dielectric layer 120 and have connection with the active contact AC, e.g., the via VI may have a polyhedral island shape extending through an entire depth of the second interlayer dielectric layer 120 to contact the top of the active contact AC. The via VI may include a barrier pattern BM and a conductive pattern FM. The barrier pattern BM may cover a bottom surface and a sidewall of the conductive pattern FM. The barrier pattern BM may not cover a top surface of the conductive pattern FM. The barrier pattern BM of the via VI may be interposed between the conductive pattern FM and the active contact AC.

The barrier pattern BM may include a metal nitride layer, e.g., one or more of a titanium nitride layer, a tungsten nitride layer, and a tantalum nitride layer. The conductive pattern FM may include a metallic material, e.g., one or more of aluminum, copper, tungsten, molybdenum, and cobalt.

Lower connection lines M1 may be provided in the third interlayer dielectric layer 130. Each of the lower connection lines M1 may have a linear shape extending in the second direction D2. The lower connection lines M1 may be arranged spaced apart from each other along the first direction D1. Each of the lower connection lines M1 may include a barrier pattern BM and a conductive pattern FM. A detailed description of the barrier pattern BM and the conductive pattern FM may be the same as that of the barrier pattern BM and the conductive pattern FM of the via VI discussed above.

For example, as illustrated in FIGS. 1 and 2A, the lower connection lines M1 may include a first lower connection line M11, a second lower connection line M12, and a third lower connection line M13 that are adjacent to each other along the first direction D1. Portions of the third interlayer dielectric layer 130 may separate between the lower connection lines M1. The second lower connection line M12 may be provided on and connected to the via VI, e.g., the second lower connection line M12 may overlap the, e.g., entire, top of the via VI in the first and second directions D1 and D2. The second lower connection line M12 may be electrically connected through the via VI to the active contact AC.

The third interlayer dielectric layer 130 may include recesses RS on an upper portion thereof, e.g., each of the recesses RS may extend from a top surface of the third interlayer dielectric layer 130 to a predetermined depth along the third direction D3. The recesses RS may be formed on corresponding lower connection lines M1. Each of the recesses RS may vertically overlap the conductive pattern FM of a corresponding lower connection line M1. When viewed in a plan view, each recess RS may extend in the second direction D2 along the, e.g., entire, lower connection line M1 thereunder.

The recess RS may expose a top surface FMt of the conductive pattern FM of the lower connection line M1. The recess RS may not expose a top surface BMt of the barrier pattern BM of the lower connection line M1. For example, the third interlayer dielectric layer 130 may cover the top surface BMt of the barrier pattern BM of the lower connection line M1.

The third interlayer dielectric layer 130 may have a top surface 130t at a level higher than that of the top surface FMt of the conductive pattern FM of the lower connection line M1, e.g., along the third direction D3. The level of the top surface 130t of the third interlayer dielectric layer 130 may be higher than that of a bottom of the recess RS.

For example, the third interlayer dielectric layer 130 may include a part 130p that vertically protrudes between a pair of neighboring lower connection lines M1, e.g., each part 130p may vertically protrude between adjacent recesses RS. The part 130p of the third interlayer dielectric layer 130 may be on the top surface BMt of the barrier pattern BM of the lower connection line M1. For example, the part 130p of the third interlayer dielectric layer 130 may cover the top surface BMt of the barrier pattern BM of the lower connection line M1, e.g., the part 130p of the third interlayer dielectric layer 130 may extend continuously to cover the top surfaces BMt of facing barrier patterns BM of adjacent lower connection lines M1. The part 130p of the third interlayer dielectric layer 130 may be positioned higher than the top surface FMt of the conductive pattern FM of the lower connection line M1.

An etch stop layer EST may be interposed between the third interlayer dielectric layer 130 and the fourth interlayer dielectric layer 140. The etch stop layer EST may cover the top surface 130t of the third interlayer dielectric layer 130. The etch stop layer EST may partially fill the recess RS. The etch stop layer EST may cover the top surface FMt of the conductive pattern FM of the lower connection line M1, which top surface FMt is exposed to the recess RS. A step difference between the recess RS and the top surface 130t of the third interlayer dielectric layer 130 may allow the etch stop layer EST to have a stepwise structure on the recess RS. The etch stop layer EST may include, e.g., one or more of SiN, SiON, SiCN, and SiCON.

Upper connection lines M2 may be provided in the fourth interlayer dielectric layer 140. Each of the upper connection lines M2 may have a linear shape extending in the first direction D1. The upper connection lines M2 may be arranged spaced apart from each other along the second direction D2. Each of the upper connection lines M2 may include a barrier pattern BM and a conductive pattern FM. A detailed description of the barrier pattern BM and the conductive pattern FM may be the same as that of the barrier pattern BM and the conductive pattern FM of the via VI discussed above.

For example, as illustrated in FIGS. 1 and 2B, the upper connection lines M2 may include a first upper connection line M21, a second upper connection line M22, and a third upper connection line M23 that are adjacent to each other along the second direction D2. Portions of the fourth interlayer dielectric layer 140 may separate between the upper connection lines M2. The second upper connection line M22 may be provided on and connected to the second lower connection line M12.

For example, the second upper connection line M22 may include a vertical extension part VP that vertically extends, e.g., along the third direction D3, toward the substrate 100. The vertical extension part VP may penetrate the fourth interlayer dielectric layer 140 and the etch stop layer EST to have a connection with the second lower connection line M12. For example, the second upper connection line M22 may be electrically connected through the vertical extension part VP to the second lower connection line M12.

The vertical extension part VP may be a portion of the second upper connection line M22. The upper connection lines M2 may be formed by a dual damascene process. In contrast, the via VI and the lower connection lines M1 may each be formed by a single damascene process. The barrier pattern BM of the second lower connection line M12 may be interposed between the via VI and the conductive pattern FM of the second lower connection line M12.

The vertical extension part VP may fill at least a portion of the recess RS above the second lower connection line M12. The vertical extension part VP may include a first segment P1 in contact through the recess RS with the conductive pattern FM of the lower connection line M1, and also may include a second segment P2 covering, e.g., a portion of, the top surface 130t of the third interlayer dielectric layer 130. The second segment P2 of the vertical extension part VP may not fill the recess RS. The first segment P1 may protrude more than the second segment P2 toward the substrate 100. For example, the first segment P1 may have a bottom surface lower than that of the second segment P2. The etch stop layer EST may cover a lower sidewall of the second segment P2. For example, as illustrated in FIGS. 2A-2B, only the second lower connection line M12 and the second upper connection line M22 among the lower and upper connection lines M1 and M2 may contact each other above the via VI, while a bottom of the fourth interlayer dielectric layer 140 may separate the other lower and upper connection lines M1 and M2 from each other.

For example, as illustrated in FIG. 1, additional vias may be formed on the substrate 100 (dashed rectangles in FIG. 1), so additional connections among different ones of the lower and upper connection lines M1 and M2 may be provided accordingly. For example, additional connection lines may be provided on the upper connection lines M2. For example, a plurality of metal layers may be provided on the upper connection lines M2.

FIGS. 3A, 4A, 5A, 6A, 7A, and 8A illustrate cross-sectional views taken along line I-I' of FIG. 1, showing a method of manufacturing a semiconductor device according to some example embodiments. FIGS. 3B, 4B, 5B, 6B, 7B, and 8B illustrate cross-sectional views taken along line II-II' of FIG. 1, showing a method of manufacturing a semiconductor device according to some example embodiments.

Figure 3A:
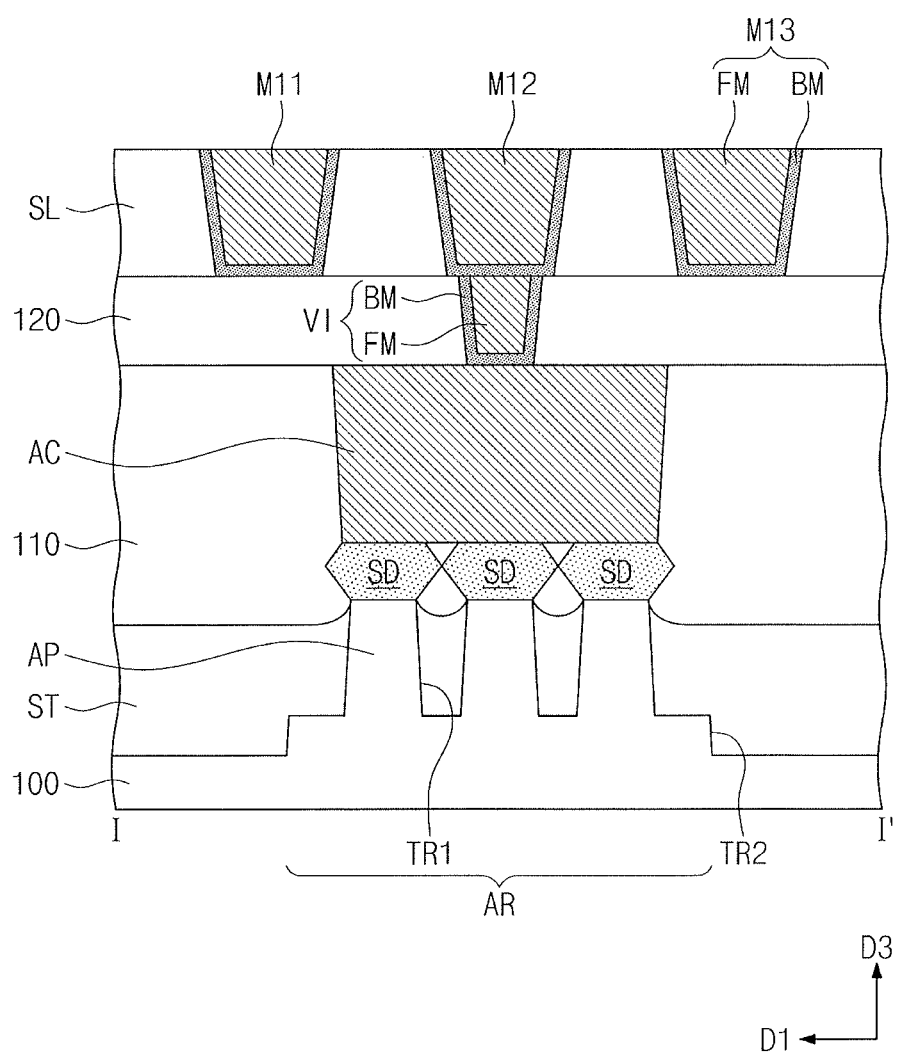
FIGS. 3A, 4A, 5A, 6A, 7A, and 8A illustrate cross-sectional views along line I-I' of FIG. 1, showing stages in a method of manufacturing a semiconductor device according to some example embodiments.
Figure 3B:
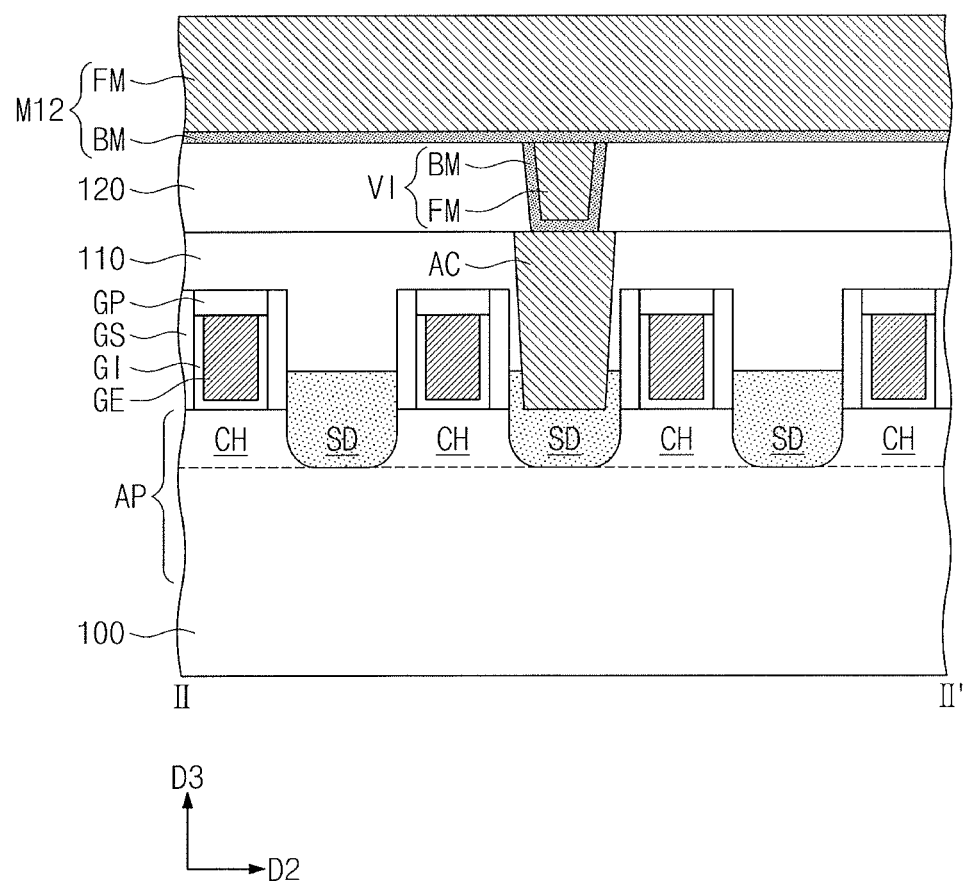
FIGS. 3B, 4B, 5B, 6B, 7B, and 8B illustrate cross-sectional views along line II-II' of FIG. 1, showing stages in a method of manufacturing a semiconductor device according to some example embodiments.

Referring to FIGS. 1, 3A, and 3B, transistors may be formed on the active region AR of the substrate 100. The transistors may include the active patterns AP having the source/drain patterns SD and may also include the gate electrodes GE running across the active patterns AP.

The first interlayer dielectric layer 110 may be formed to cover the transistors. The active contact AC may be formed to penetrate the first interlayer dielectric layer 110 and to have connection with the source/drain patterns SD.

The second interlayer dielectric layer 120 may be formed on the first interlayer dielectric layer 110. The via VI may be formed in the second interlayer dielectric layer 120. The via VI may be formed by a single damascene process. For example, the formation of the via VI may include forming a hole by patterning the second interlayer dielectric layer 120, and forming the barrier pattern BM and the conductive pattern FM that fill the hole.

A sacrificial layer SL may be formed on the second interlayer dielectric layer 120. The sacrificial layer SL may include, e.g., a silicon oxide layer or a carbon-containing silicon oxide layer. Lower connection lines M1 may be formed in the sacrificial layer SL. The lower connection lines M1 may include first, second, and third lower connection lines M11, M12, and M13 that are adjacent to each other. The lower connection lines M1 may be formed by a single damascene process. For example, the formation of the lower connection lines M1 may include forming holes by patterning the sacrificial layer SL, and forming the barrier pattern BM and the conductive pattern FM that fill each of the holes.

Figure 4A:
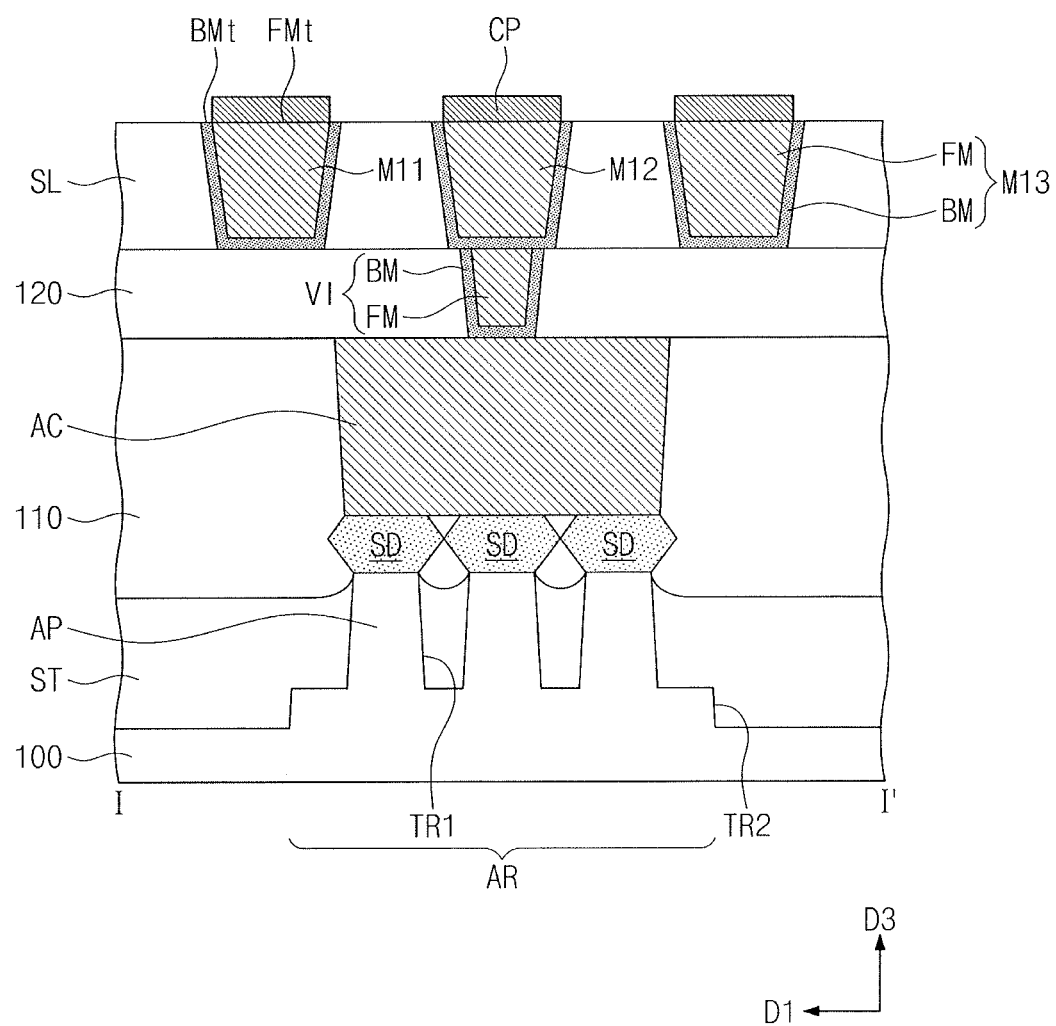
Figure 4B:
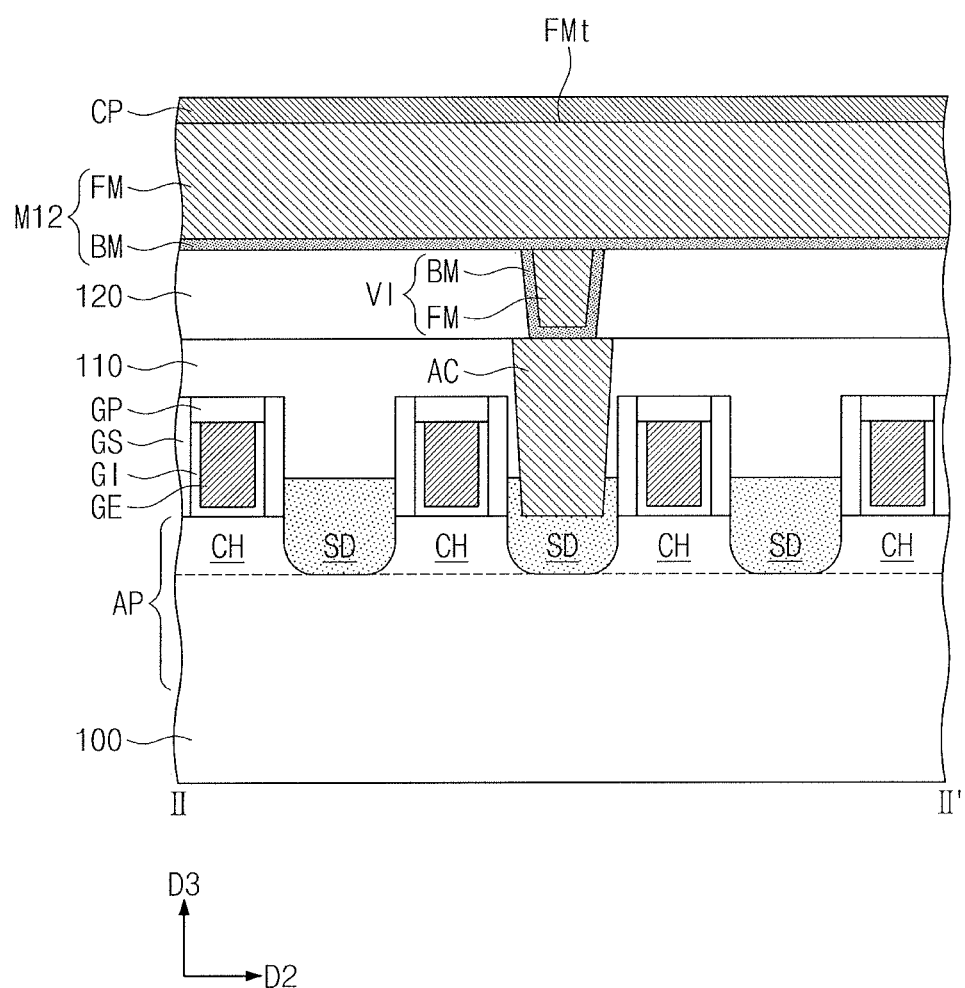

Referring to FIGS. 1, 4A, and 4B, capping patterns CP may be formed on corresponding lower connection lines M1. The capping pattern CP may be formed to cover the top surface FMt of the conductive pattern FM of the lower connection line M1. The capping pattern CP may not cover the top surface BMt of the barrier pattern BM of the lower connection line M1.

The formation of the capping patterns CP may use spin coating, ALD, CVD, or PVD. The capping patterns CP may be formed using metal, e.g., Ti, Mo, Ta, Mn, Al, Co, Ru, or a combination thereof.

The capping pattern CP may be selectively formed on the conductive pattern FM of the lower connection line M1. For example, the capping pattern CP may be formed using metal exhibiting affinity to that of the conductive pattern FM, so the capping pattern CP may be self-alignedly formed on the conductive pattern FM, e.g., without being formed on the barrier pattern BM.

Figure 5A:
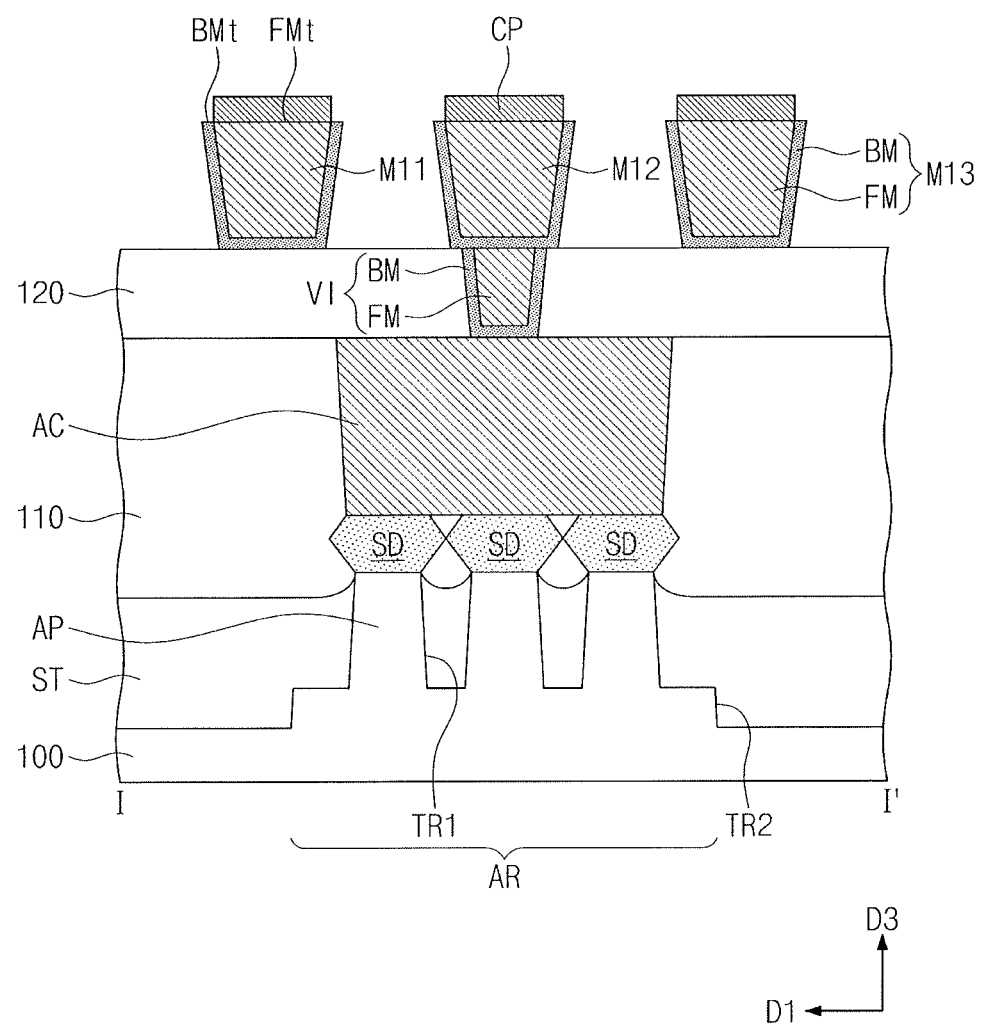
Figure 5B:
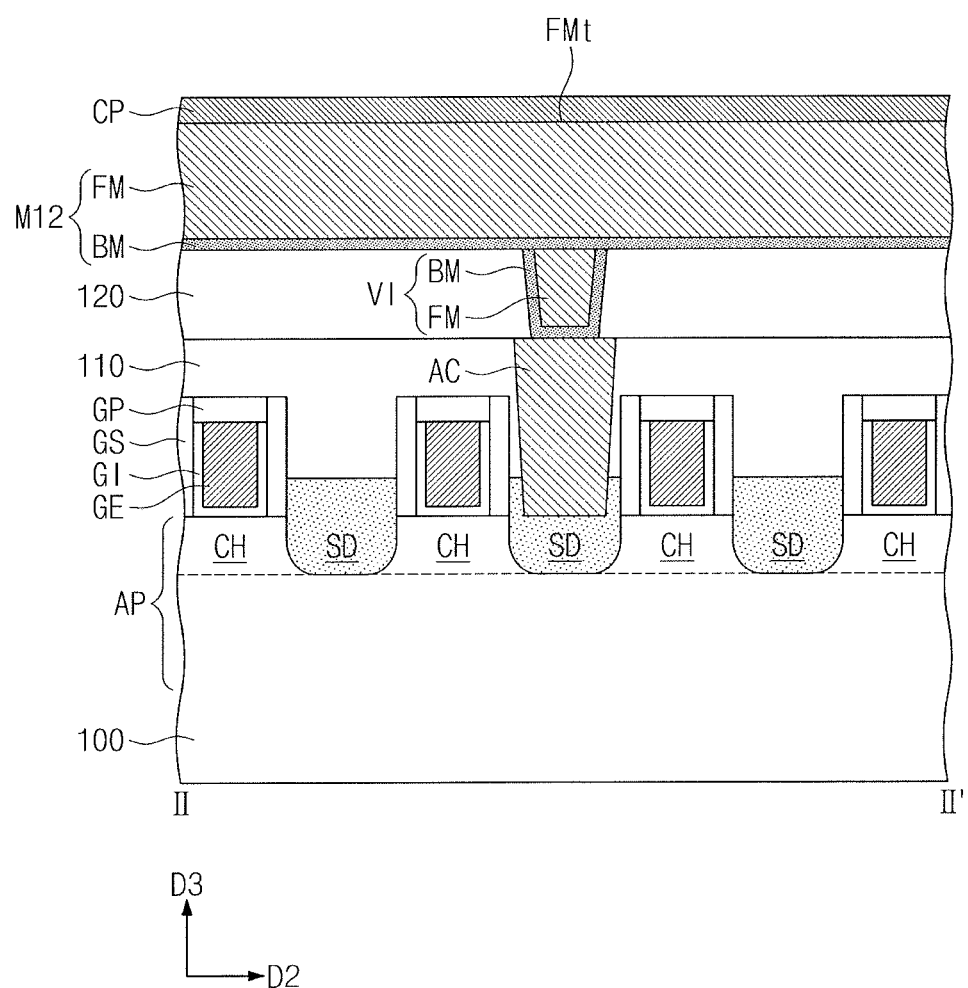

Referring to FIGS. 1, 5A, and 5B, the sacrificial layer SL may be selectively removed. The removal of the sacrificial layer SL may include performing a wet etching process, an ashing process, a dry etching process, or a combination thereof. For example, when the sacrificial layer SL contains carbon, an ashing process may be performed to damage the sacrificial layer SL, and then a wet etching process or a dry etching process may be performed to selectively remove the damaged sacrificial layer SL. The second interlayer dielectric layer 120 may be kept when the sacrificial layer SL is removed. The removal of the sacrificial layer SL may expose sidewalls of the capping patterns CP and sidewalls of the lower connection lines M1.

Figure 6A:
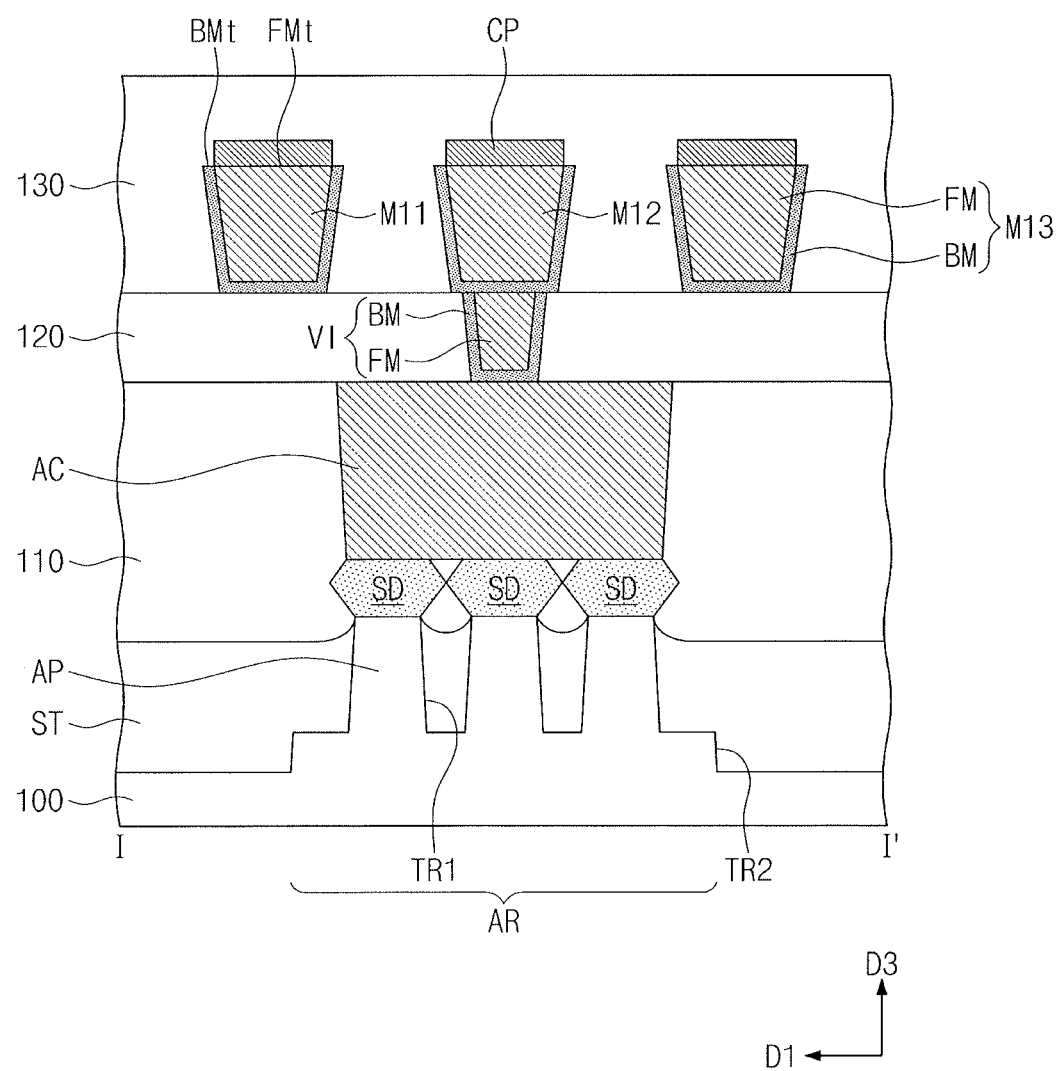
Figure 6B:
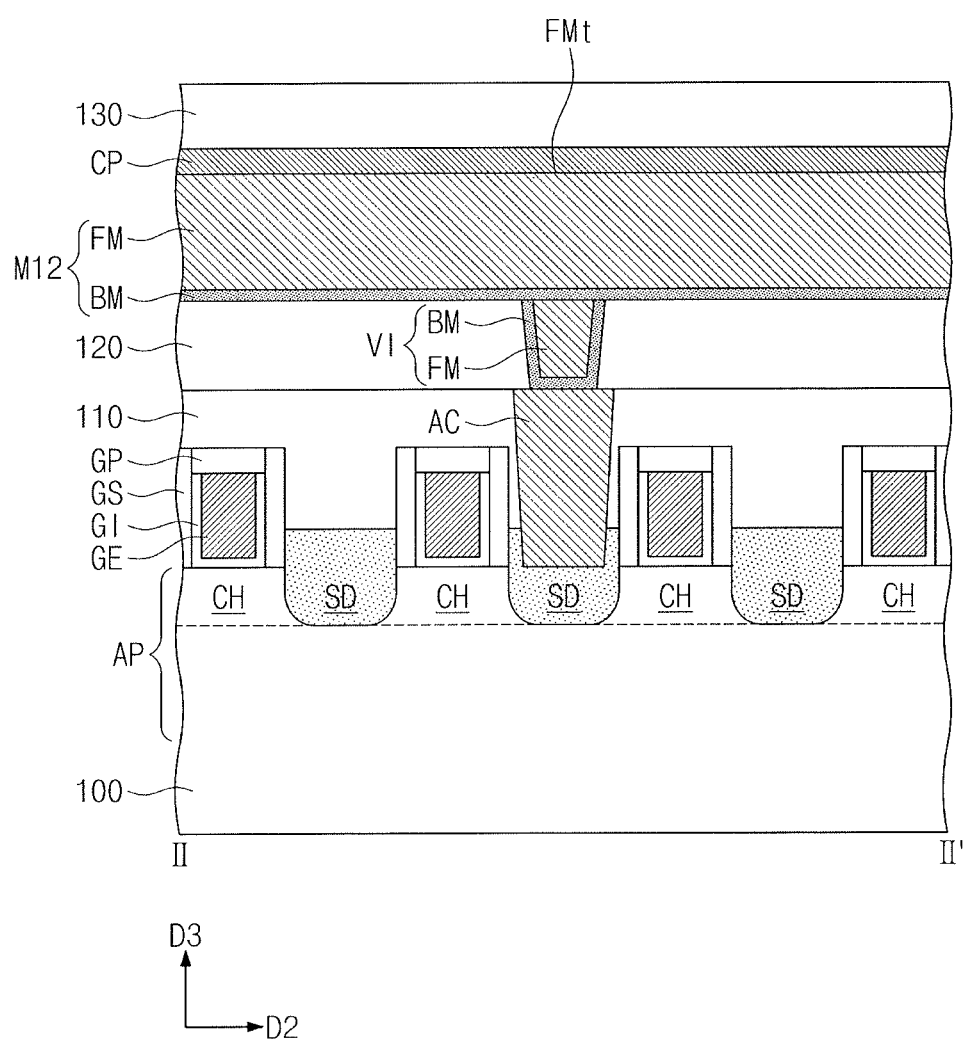

Referring to FIGS. 1, 6A, and 6B, the third interlayer dielectric layer 130 may be formed to cover the exposed capping patterns CP and lower connection lines M1. The third interlayer dielectric layer 130 may cover top surfaces of the capping patterns CP. The third interlayer dielectric layer 130 may have a top surface higher than those of the capping patterns CP. The third interlayer dielectric layer 130 may be formed by an ALD process or a flowable chemical vapor deposition (FCVD) process exhibiting superior gap-fill characteristics. The third interlayer dielectric layer 130 may include a silicon oxide layer whose dielectric constant is low.

Figure 7A:
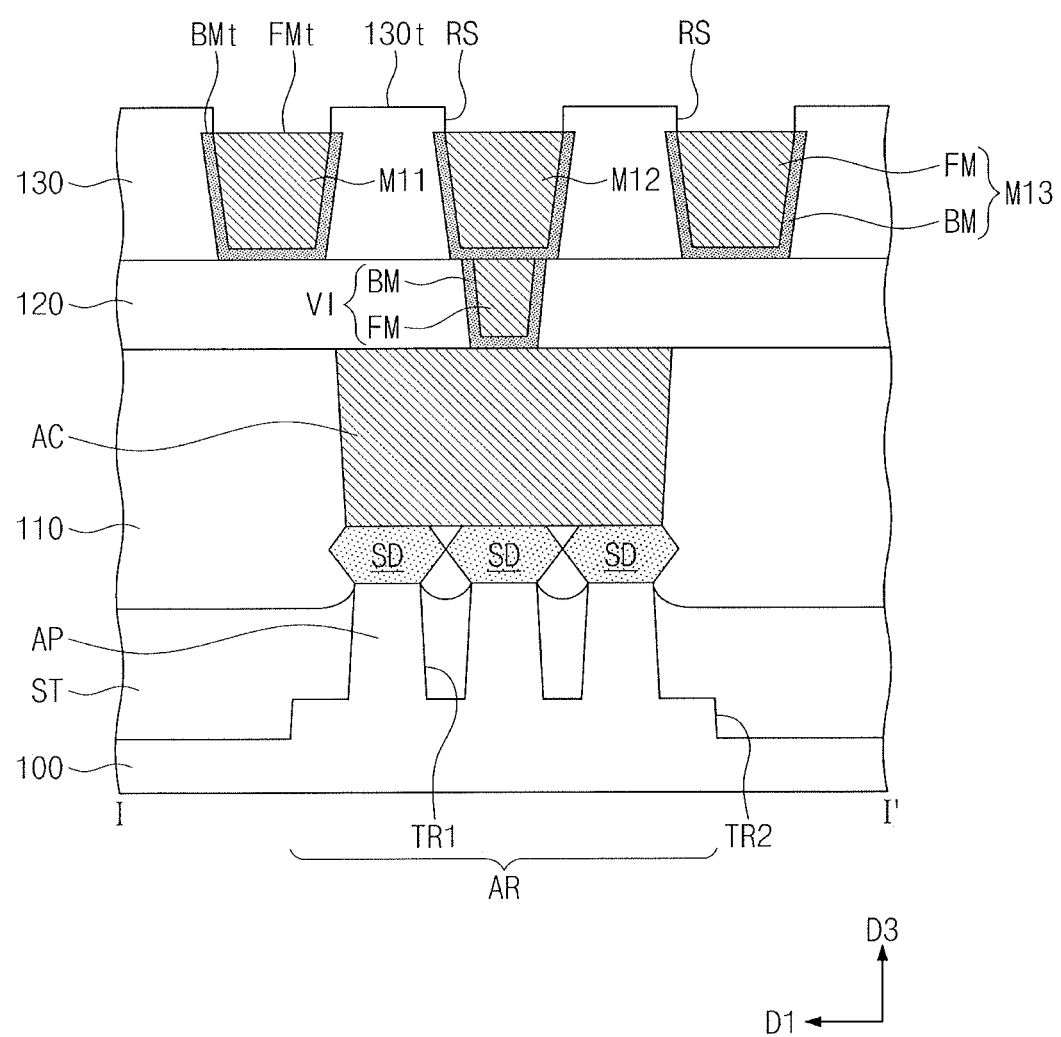
Figure 7B:
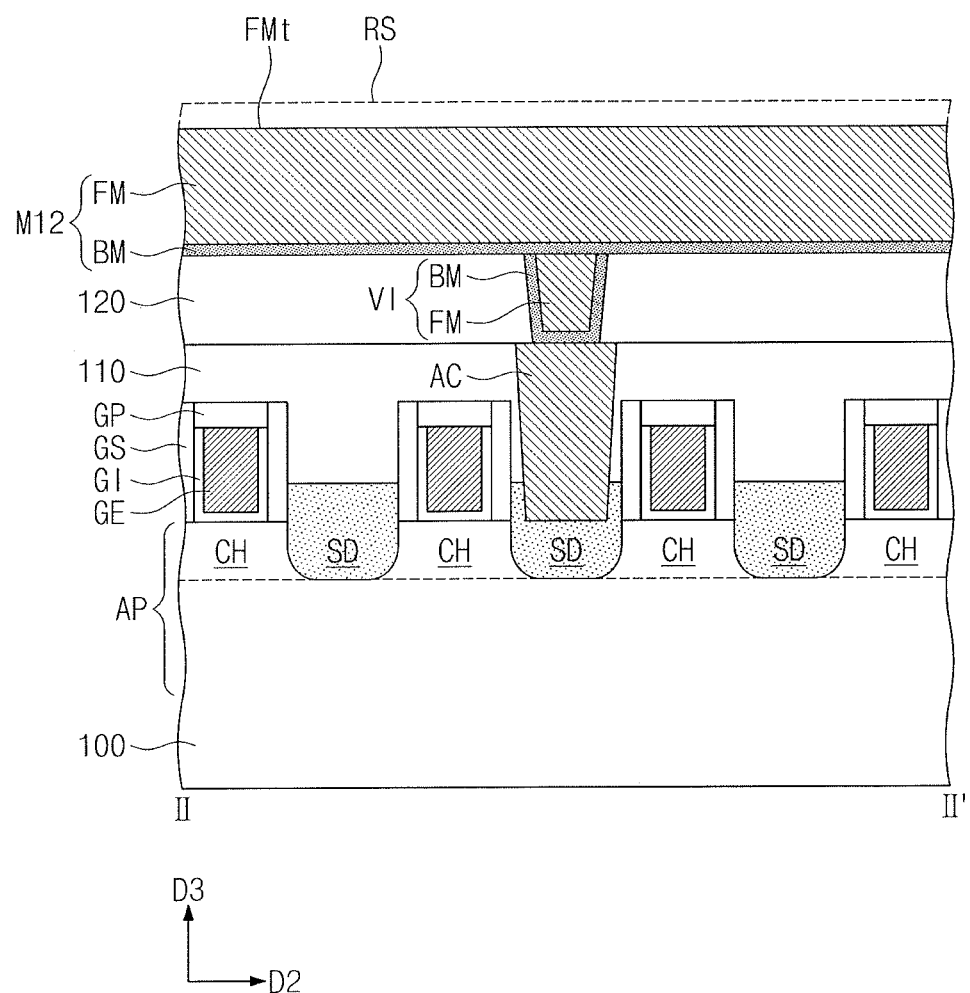

Referring to FIGS. 1, 7A, and 7B, the third interlayer dielectric layer 130 may undergo a planarization process, which is performed until the top surfaces of the capping patterns CP are exposed. As a result, the third interlayer dielectric layer 130 may have a planarized top surface 130t, which is coplanar with the top surfaces of the capping patterns CP. The top surfaces of the capping patterns CP may be exposed.

The exposed capping patterns CP may be selectively removed. The capping patterns CP may be removed by a selective wet etching process. The removal of the capping patterns CP may define the recesses RS on an upper portion of the third interlayer dielectric layer 130. Each of the recesses RS may expose the top surface FMt of the conductive pattern FM of the lower connection line M1. For example, the top surface FMt of the conductive pattern FM may define a bottom of the recess RS. The recess RS may extend in the second direction D2 along the lower connection line M1 thereunder. The top surface 130t of the third interlayer dielectric layer 130 may be located at a level higher than that of the top surface FMt of the conductive pattern FM of the lower connection line M1.

Figure 8A:
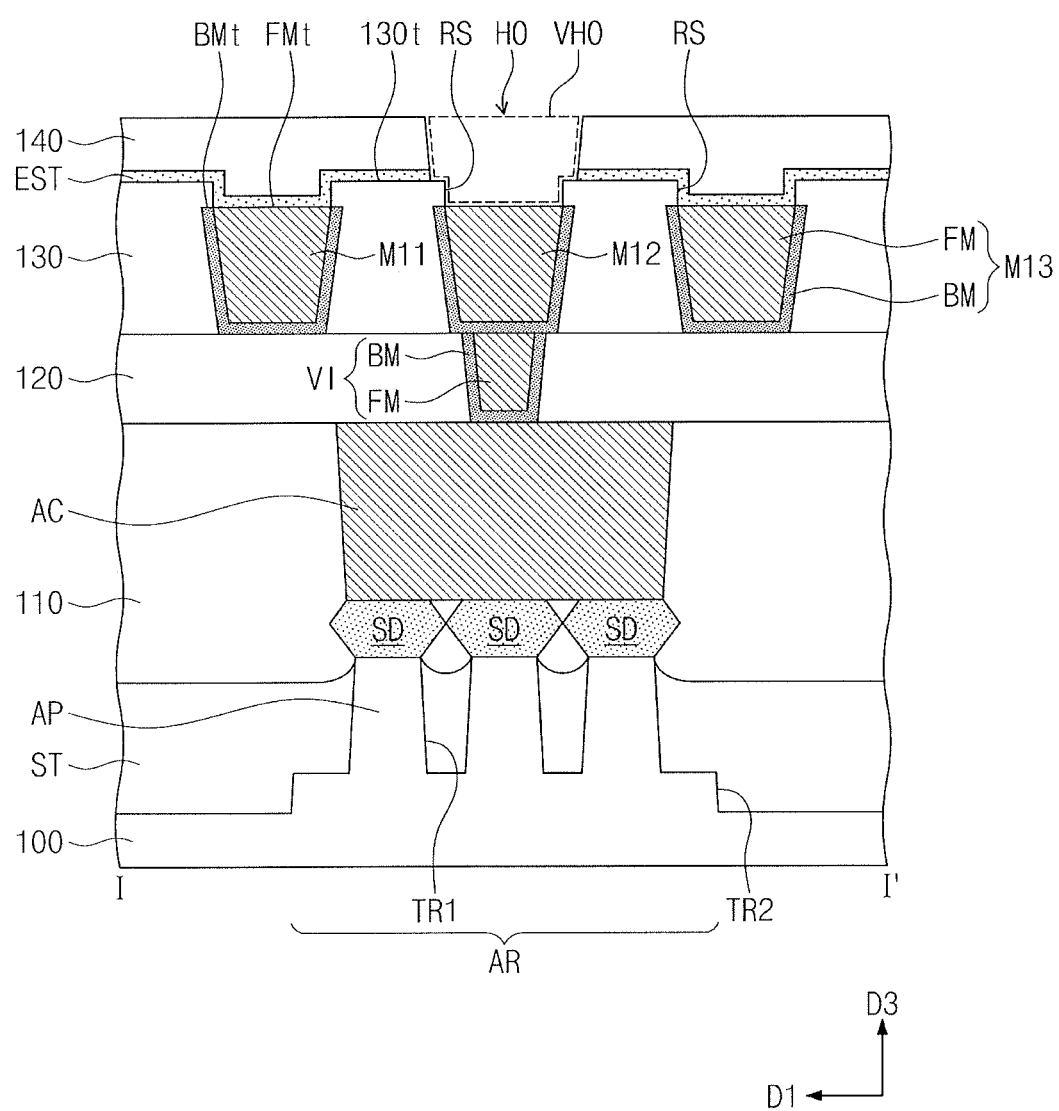
Figure 8B:
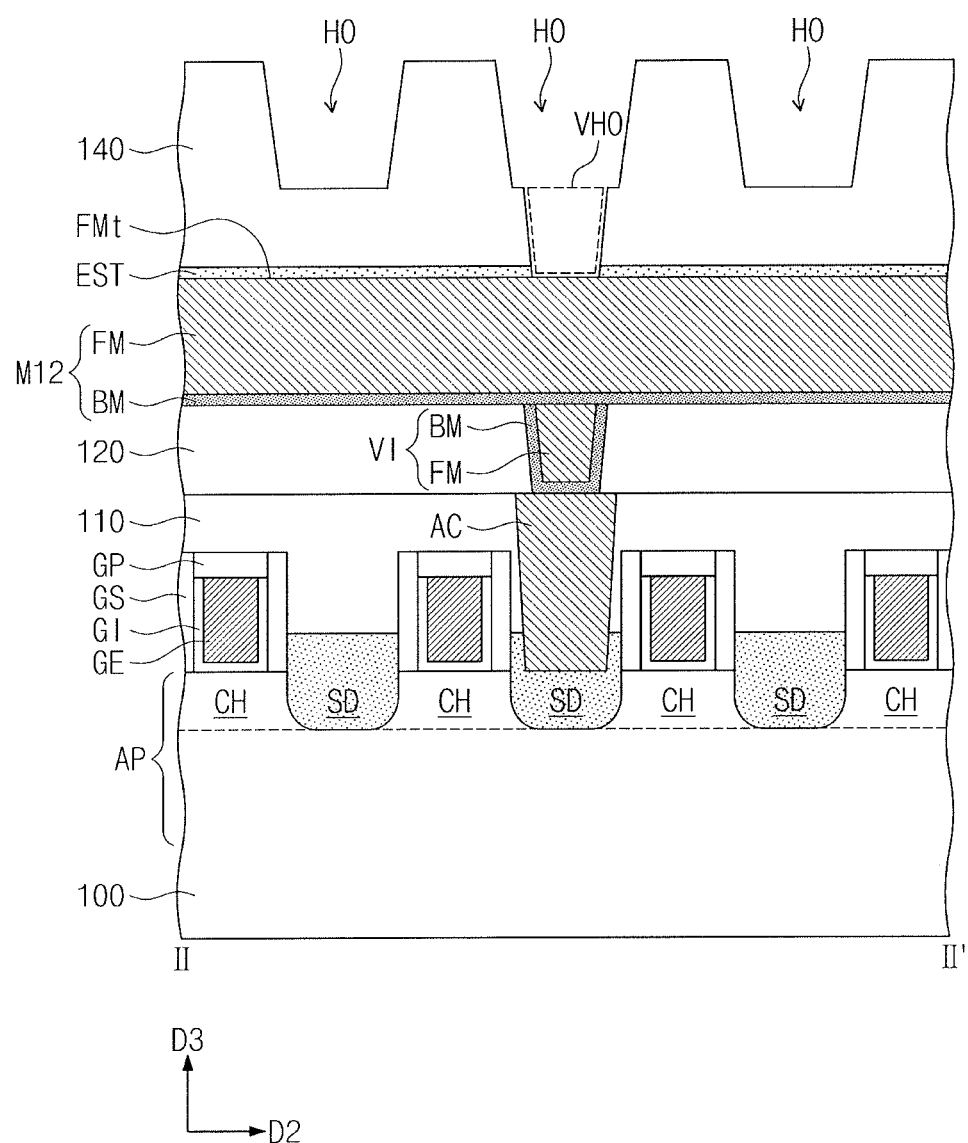

Referring to FIGS. 1, 8A, and 8B, an etch stop layer EST may be formed on the third interlayer dielectric layer 130. The etch stop layer EST may be conformally formed to partially fill the recess RS. The etch stop layer EST may include, e.g., one or more of SiN, SiON, SiCN, and SiCON.

The fourth interlayer dielectric layer 140 may be formed on the etch stop layer EST. The fourth interlayer dielectric layer 140 may be patterned to form connection line holes HO. For example, a patterning process may be performed twice to cause at least one connection line hole HO to include a vertical extension hole VHO. The vertical extension hole VHO may penetrate the etch stop layer EST and expose the top surface FMt of the conductive pattern FM of the second lower connection line M12.

The vertical extension hole VHO may be formed in a self-aligned manner caused by the recess RS. The vertical extension hole VHO may not expose the top surface BMt of the barrier pattern BM of the second lower connection line M12. The recess RS may allow the vertical extension hole VHO to selectively expose the top surface FMt of the conductive pattern FM of the second lower connection line M12.

Referring back to FIGS. 1, 2A, and 2B, the upper connection lines M2 may be formed to fill the connection line holes HO. The upper connection lines M2 may include first, second, and third upper connection lines M21, M22, and M23 that are adjacent to each other. The upper connection lines M2 may be formed by a dual damascene process. The formation of the upper connection lines M2 may include forming the barrier pattern BM and the conductive pattern FM that fill each of the connection line holes HO.

The sacrificial layer SL may be damaged during the formation of the lower connection lines M1. According to some example embodiments, the damaged sacrificial layer SL may be replaced with the third interlayer dielectric layer 130. Because the lower connection lines M1 are provided therebetween with a damage-free dielectric layer whose dielectric constant is low, it may be possible to reduce a parasitic capacitance and to improve electrical characteristics of semiconductor devices.

In addition, the vertical extension part VP of the second upper connection line M22 may be formed in a self-aligned manner caused by the recess RS on the upper portion of the third interlayer dielectric layer 130. As a result, an electrical short may be avoided between the vertical extension part VP of the second upper connection line M22 and one of the first lower connection line M11 and the third lower connection line M13.

Figure 9A:
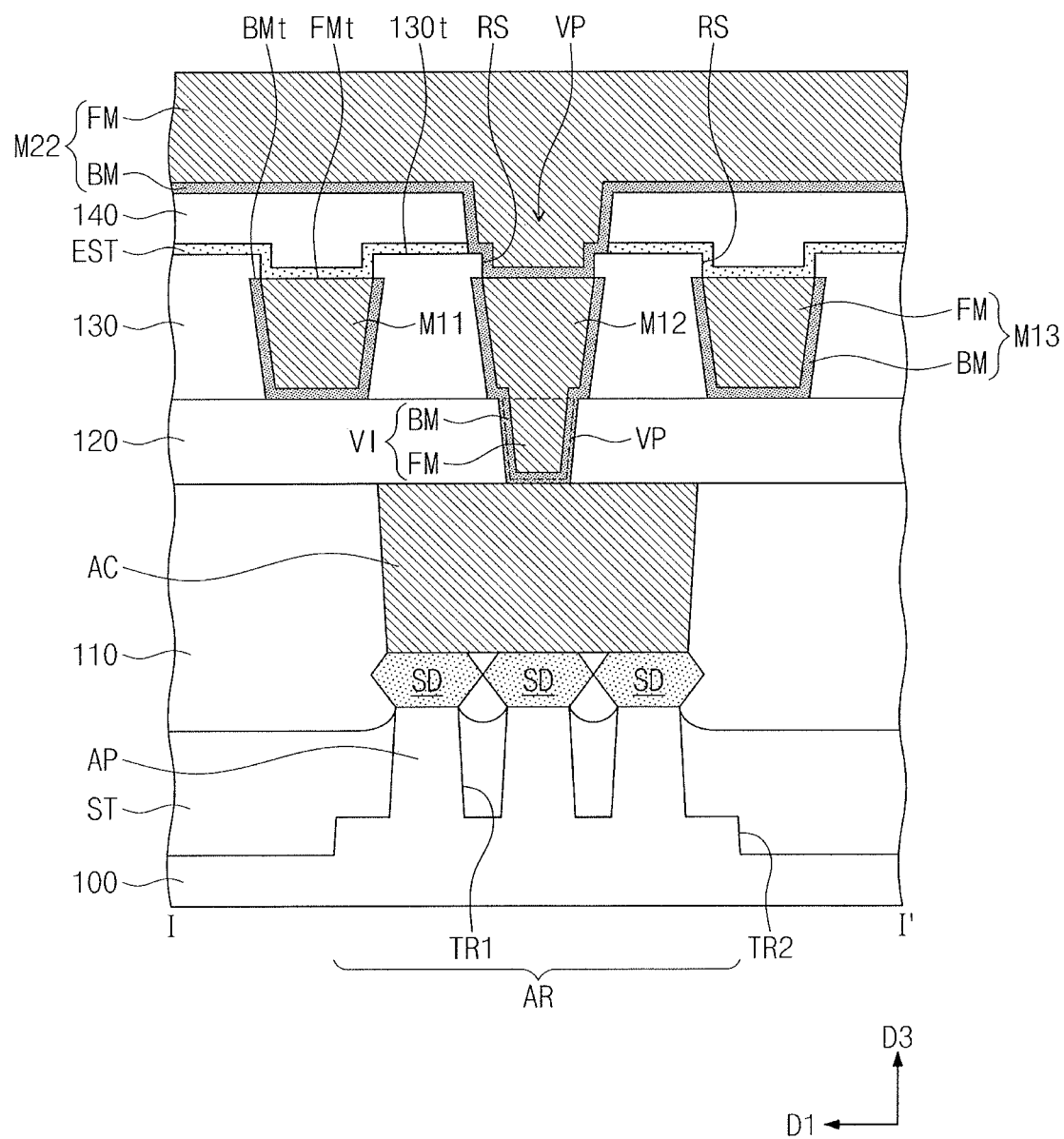
FIGS. 9A and 9B illustrate cross-sectional views along lines I-I' and II-II' of FIG. 1, respectively, of a semiconductor device according to some example embodiments.
Figure 9B:
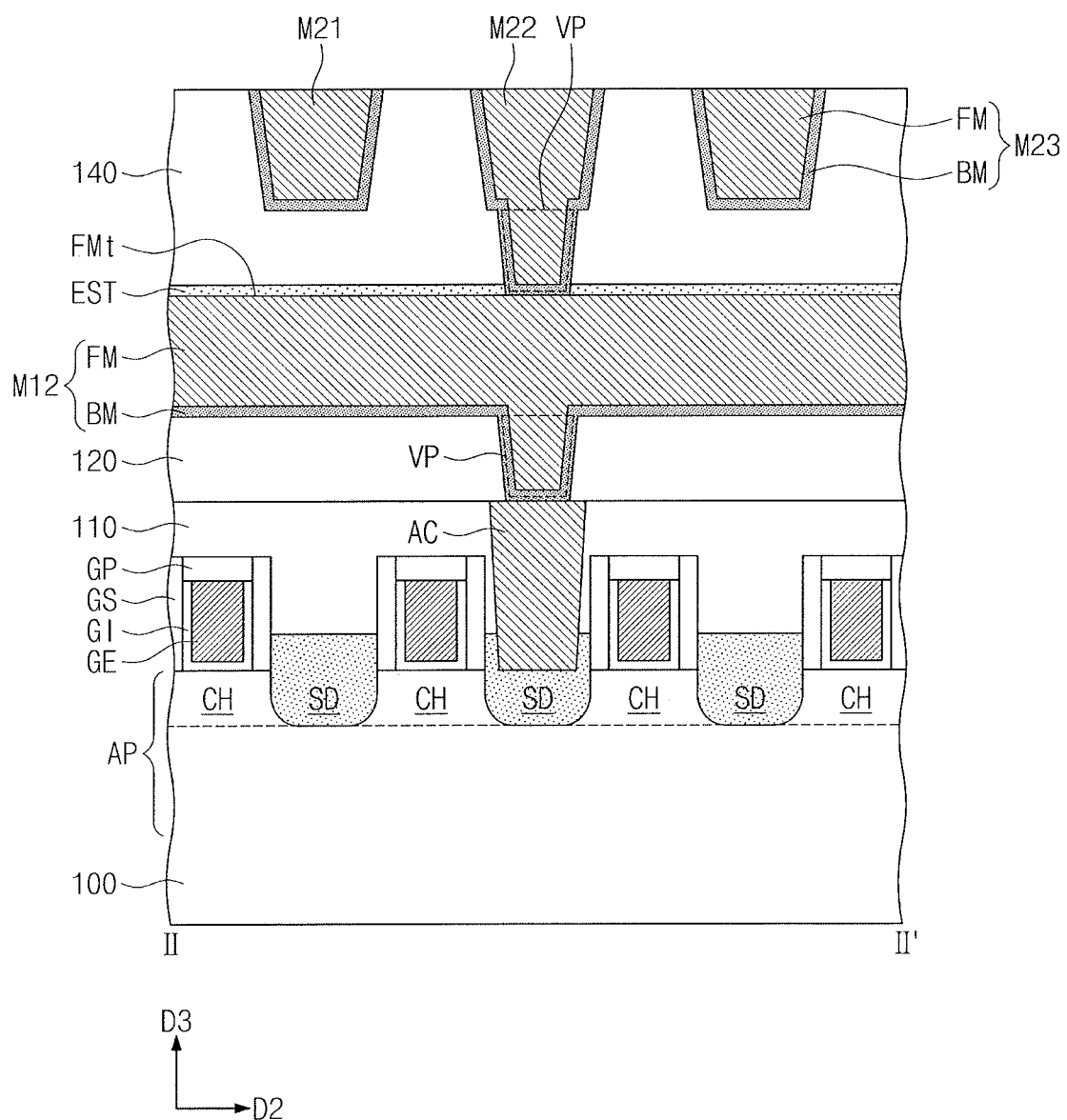

FIGS. 9A and 9B illustrate cross-sectional views respectively taken along lines I-I' and II-II' of FIG. 1, showing a semiconductor device according to some example embodiments. In the embodiment that follows, a detailed description of technical features repetitive to those of the semiconductor device discussed above with reference to FIGS. 1, 2A, and 2B will be omitted, and a difference thereof will be discussed in detail.

Referring to FIGS. 1, 9A, and 9B, the lower connection lines M1 may be formed by a dual damascene process. For example, the second lower connection line M12 may include a vertical extension part VP that vertically extends toward the substrate 100. The vertical extension part VP may penetrate the second interlayer dielectric layer 120 and have connection with the active contact AC. For example, the second lower connection line M12 may be electrically connected through the vertical extension part VP to the active contact AC.

The second interlayer dielectric layer 120 may cover a sidewall of the vertical extension part VP of the second lower connection line M12. Because the third interlayer dielectric layer 130 is provided on the second interlayer dielectric layer 120, the third interlayer dielectric layer 130 may be located higher than the vertical extension part VP of the second lower connection line M12.

Figure 10A:
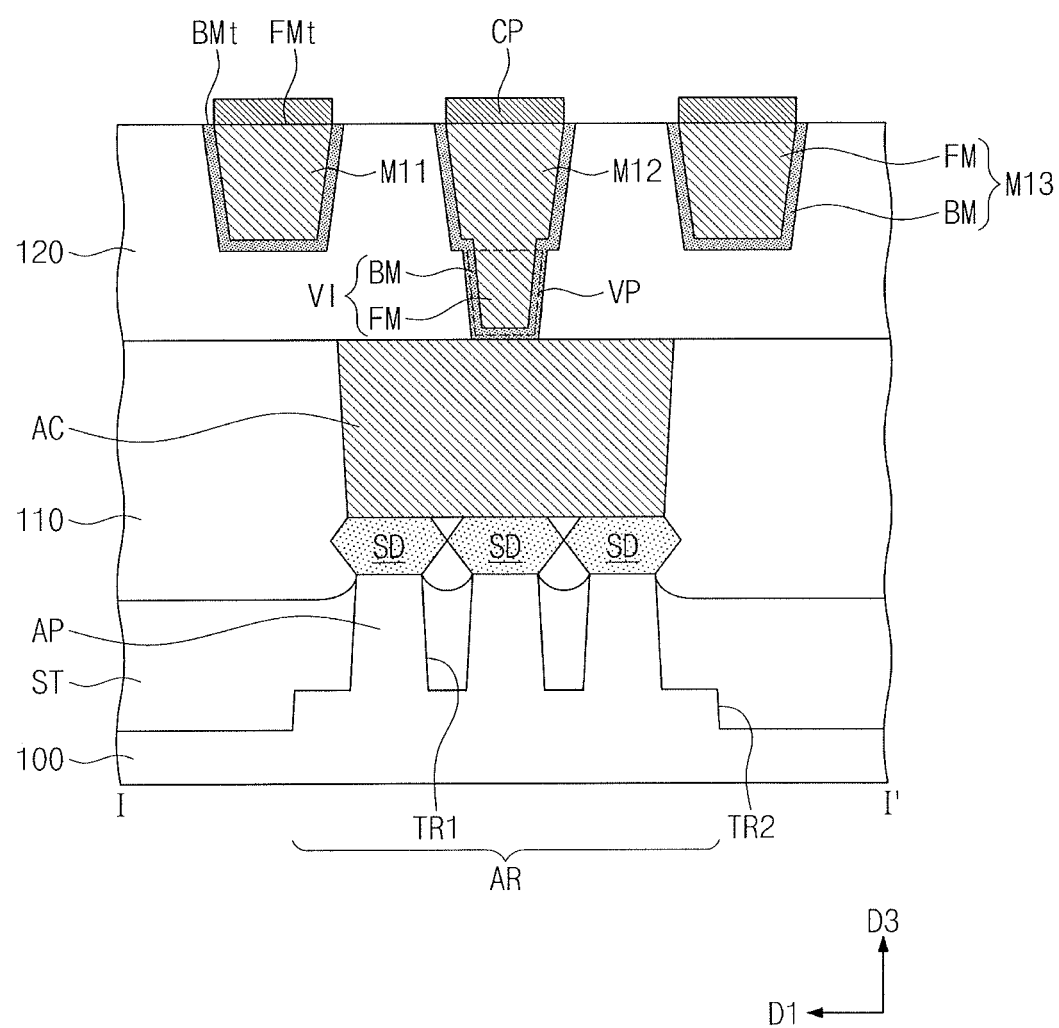
FIGS. 10A and 11A illustrate cross-sectional views along line I-I' of FIG. 1, showing stages in a method of manufacturing a semiconductor device according to some example embodiments.
Figure 10B:
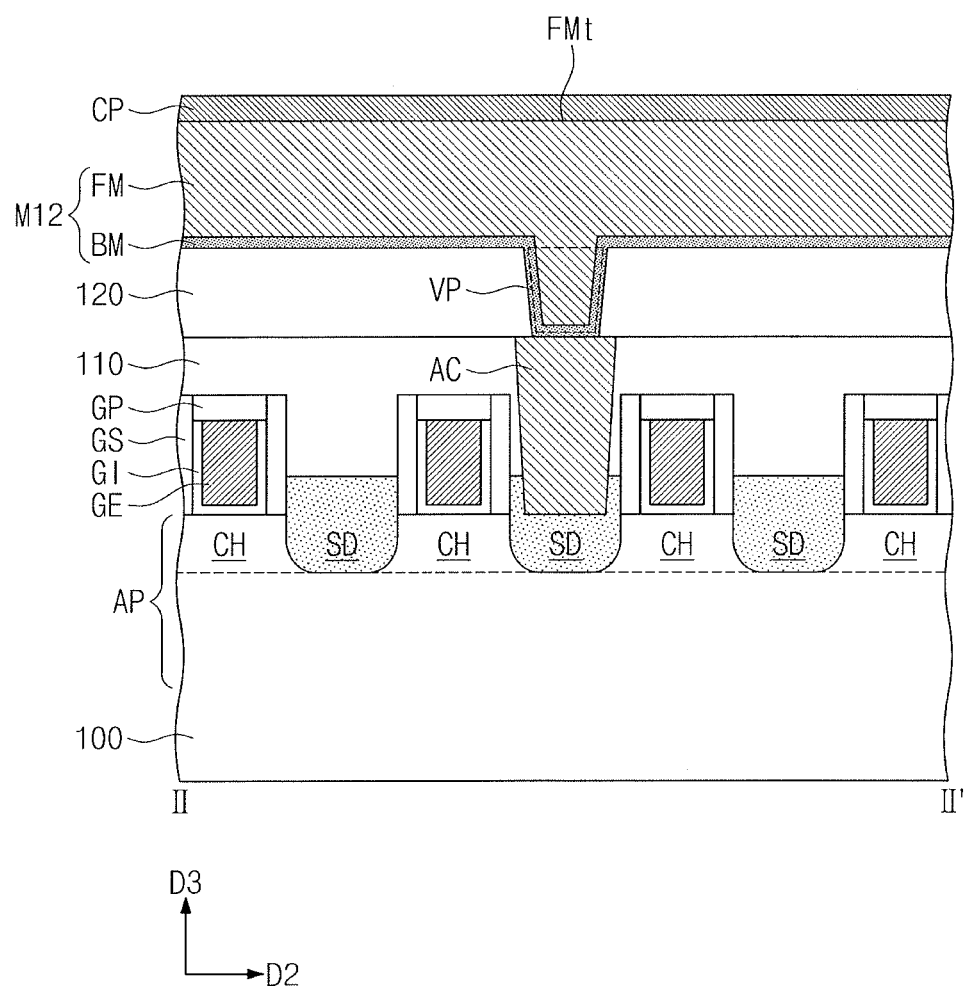
FIGS. 10B and 11B illustrate cross-sectional views along line II-II' of FIG. 1, showing stages in a method of manufacturing a semiconductor device according to some example embodiments.
Figure 11A:
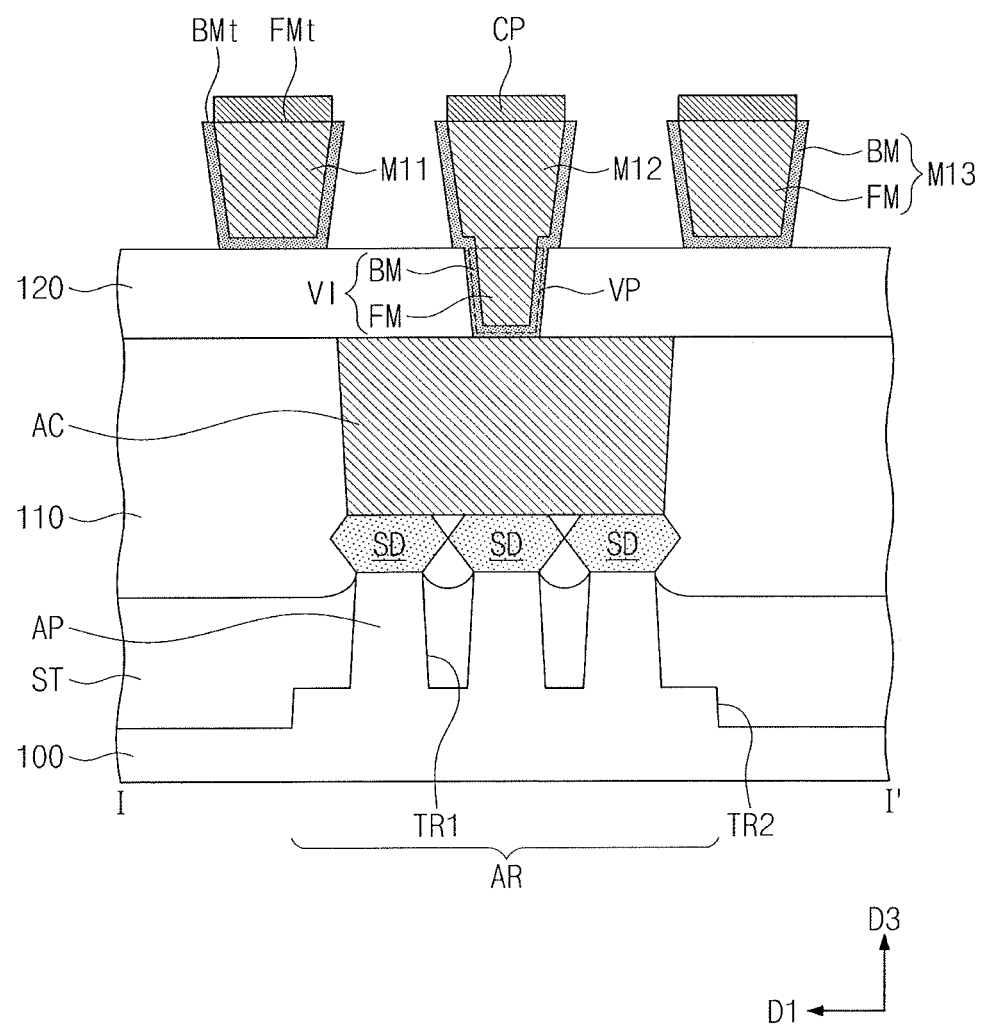
Figure 11B:
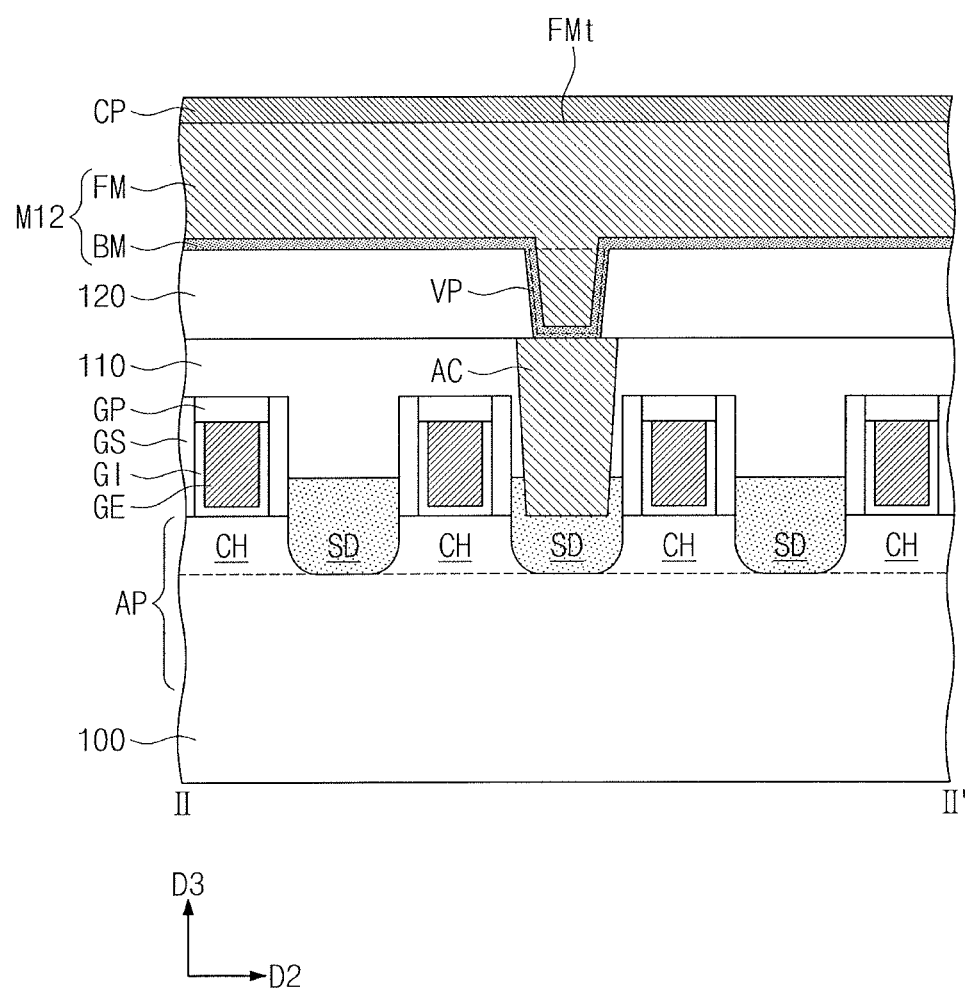

FIGS. 10A and 11A illustrate cross-sectional views taken along line I-I' of FIG. 1, showing a method of manufacturing a semiconductor device according to some example embodiments. FIGS. 10B and 11B illustrate cross-sectional views taken along line II-II' of FIG. 1, showing a method of manufacturing a semiconductor device according to some example embodiments. In the embodiment that follows, a detailed description of technical features repetitive to those of the manufacturing method discussed above with reference to FIGS. 1 to 8B will be omitted, and a difference thereof will be discussed in detail.

Referring to FIGS. 1, 10A, and 10B, the lower connection lines M1 may be formed in the second interlayer dielectric layer 120. The lower connection lines M1 may be formed by a dual damascene process. For example, the formation of the lower connection lines M1 may be substantially the same as that of the upper connection lines M2 discussed above with reference to FIGS. 8A and 8B. The capping patterns CP may be formed on corresponding lower connection lines M1.

Referring to FIGS. 1, 11A, and 11B, the second interlayer dielectric layer 120 may be recessed. During the recess of the second interlayer dielectric layer 120, an upper portion of the second interlayer dielectric layer 120 may be removed, and a lower portion of the second interlayer dielectric layer 120 may remain. The remaining second interlayer dielectric layer 120 may cover the vertical extension part VP of the second lower connection line M12.

In case that the second interlayer dielectric layer 120 is completely removed, the lower connection lines M1 may collapse. In the present embodiment, because the upper portion of the second interlayer dielectric layer 120 is removed and the lower portion of the second interlayer dielectric layer 120 remains, the lower connection lines M1 may be stably supported by the lower portion of the second interlayer dielectric layer 120.

Subsequent processes may be the same as those discussed above with reference to FIGS. 6A to 8B.

Figure 12:
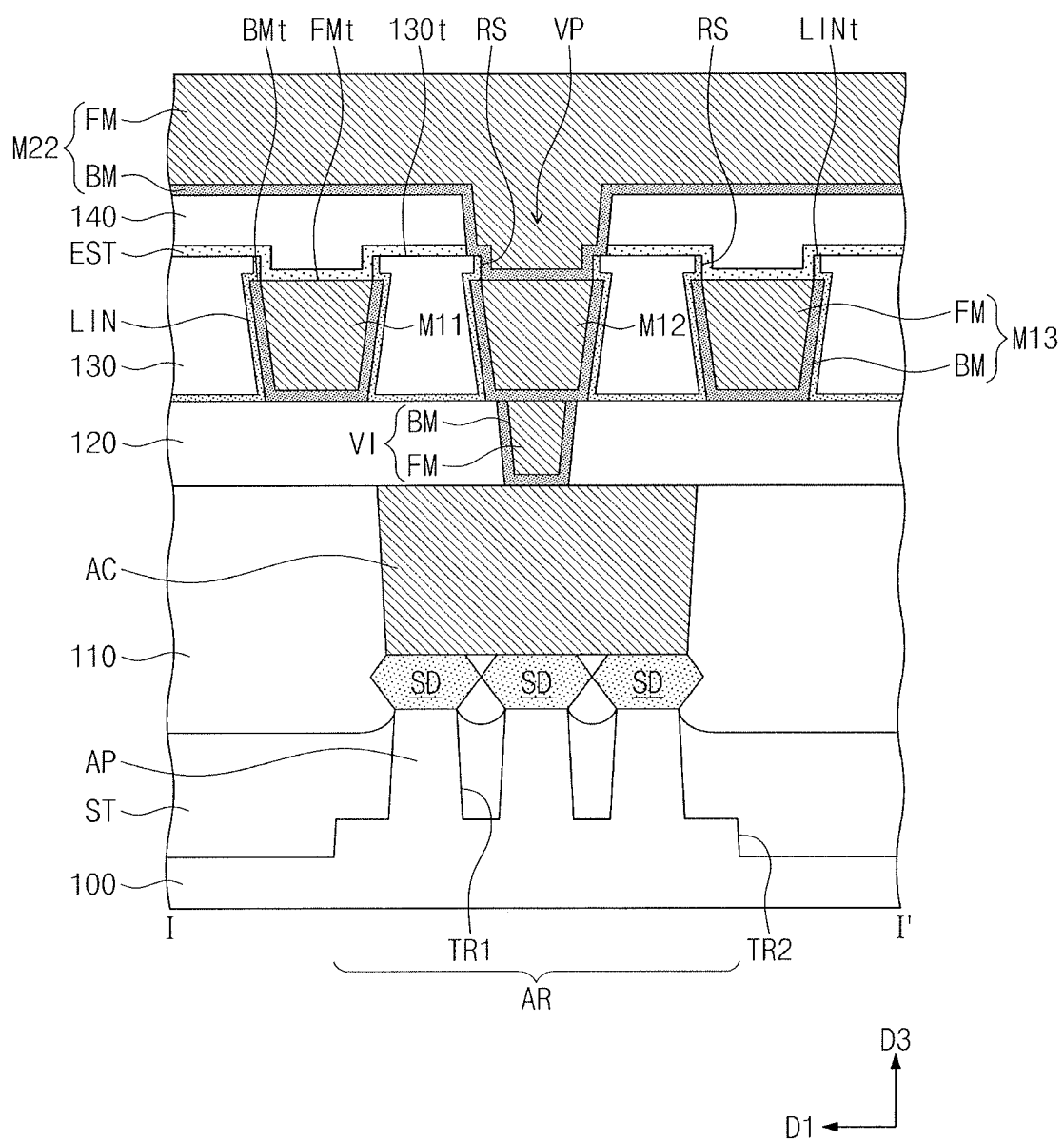
FIG. 12 illustrates a cross-sectional view along line I-I' of FIG. 1, showing a semiconductor device according to some example embodiments.

FIG. 12 illustrates a cross-sectional view taken along line I-I' of FIG. 1, showing a semiconductor device according to some example embodiments. In the embodiment that follows, a detailed description of technical features repetitive to those of the semiconductor device discussed above with reference to FIGS. 1, 2A, and 2B will be omitted, and a difference thereof will be discussed in detail.

Referring to FIGS. 1, 2B, and 12, one or more liners LIN may be interposed between the third interlayer dielectric layer 130 and the lower connection lines M1. The liner LIN may include a first segment that extends horizontally and covers a top surface of the second interlayer dielectric layer 120, and may also include a second segment that extends vertically and covers the sidewall of the lower connection line M1. For example, the liner LIN may include a silicon oxide layer or a silicon nitride layer.

The liner LIN adjacent to the recess RS may cover the top surface BMt of the barrier pattern BM of the lower connection line M1. The liner LIN adjacent to the recess RS may define a side of the recess RS. The liner LIN adjacent to the recess RS may be interposed between the etch stop layer EST and the third interlayer dielectric layer 130. The liner LIN adjacent to the recess RS may have a top surface LINt coplanar with the top surface 130t of the third interlayer dielectric layer 130. The top surface LINt of the liner LIN may be located at a level higher than that of the top surface FMt of the conductive pattern FM of the lower connection line M1.

Figure 13:
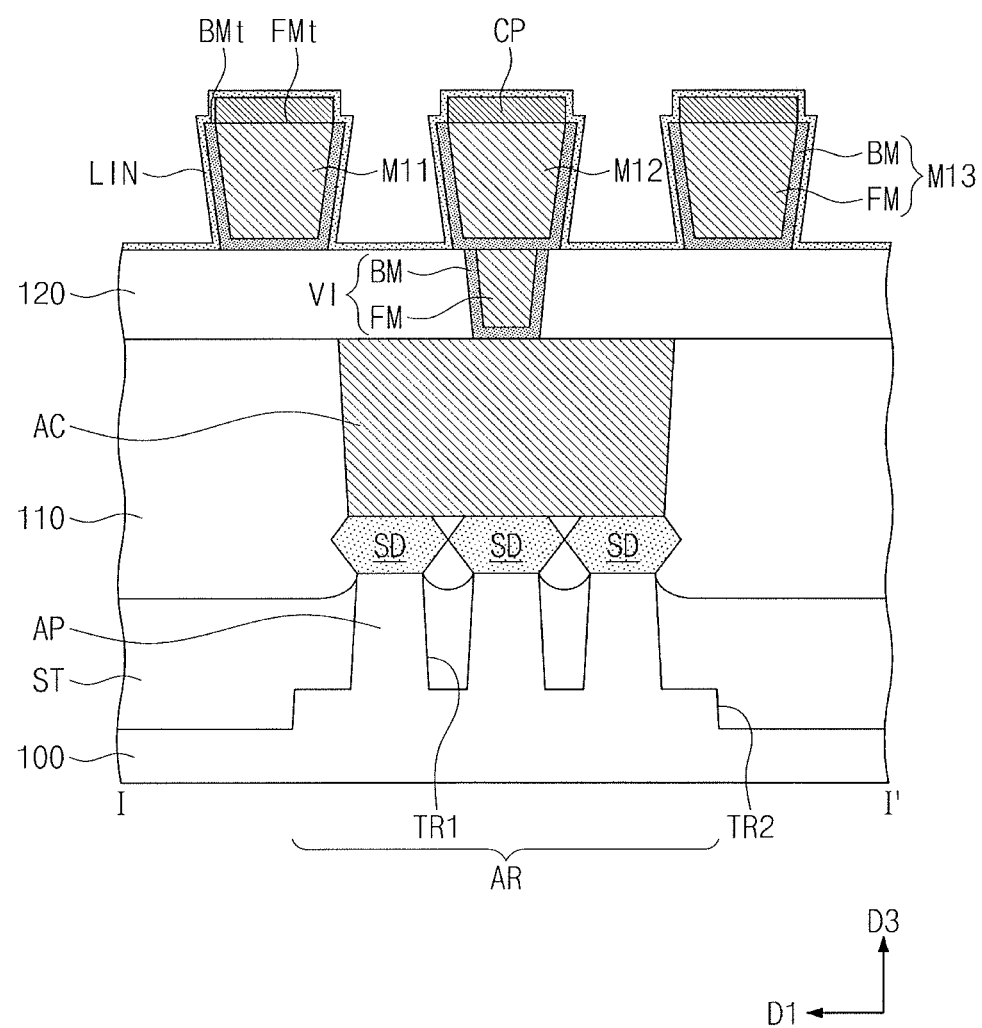
FIGS. 13 and 14 illustrate cross-sectional views along line I-I' of FIG. 1, showing stages in a method of manufacturing a semiconductor device according to some example embodiments.
Figure 14:
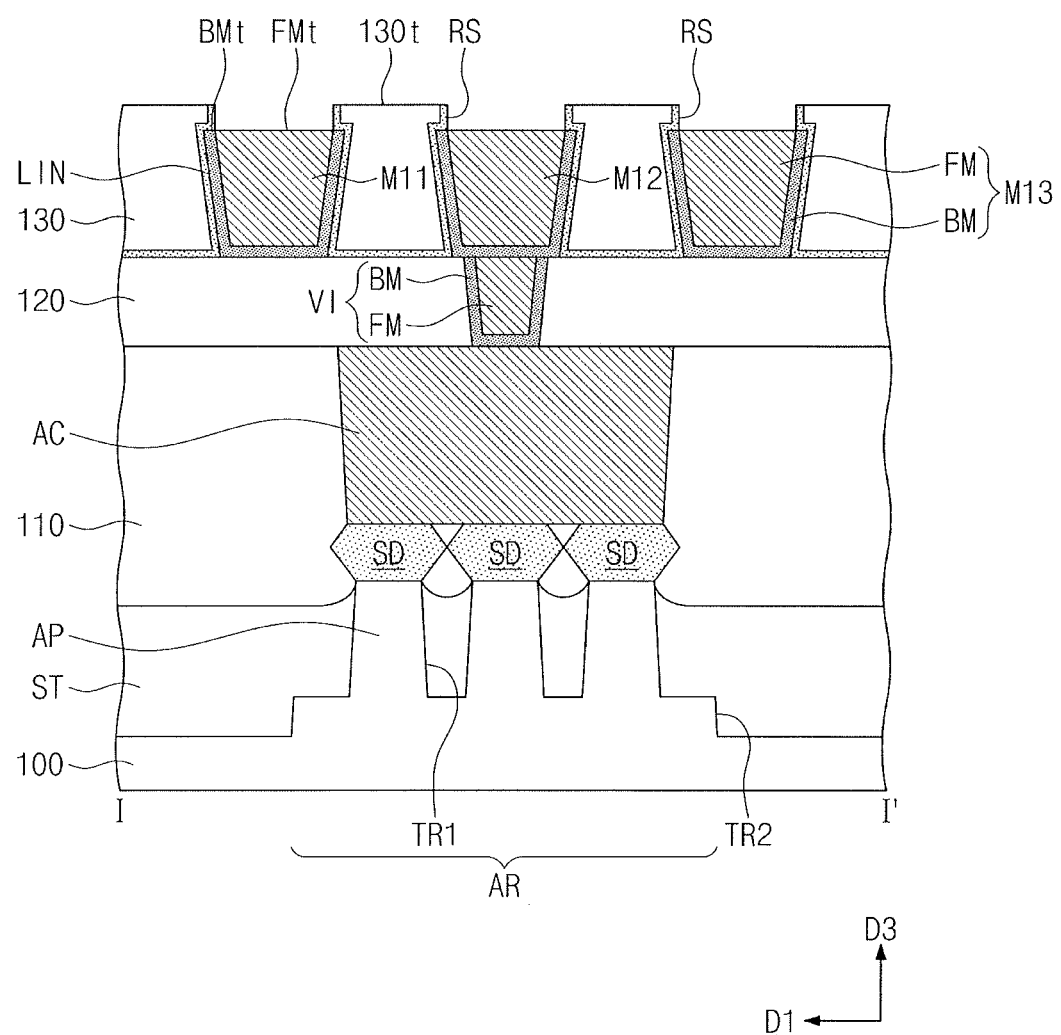

FIGS. 13 and 14 illustrate cross-sectional views taken along line I-I' of FIG. 1, showing a method of manufacturing a semiconductor device according to some example embodiments. In the embodiment that follows, a detailed description of technical features repetitive to those of the manufacturing method discussed above with reference to FIGS. 1 to 8B will be omitted, and a difference thereof will be discussed in detail.

Referring to FIGS. 1 and 13, the liner LIN may be conformally formed on a resultant structure of FIGS. 5A and 5B. The liner LIN may cover surfaces of the exposed lower connection lines M1 and surfaces of the exposed capping patterns CP. The liner LIN may protect the exposed lower connection lines M1.

Referring to FIGS. 1 and 14, the third interlayer dielectric layer 130 may be formed on the liner LIN. The third interlayer dielectric layer 130 may undergo a planarization process, which is performed until the top surfaces of the capping patterns CP are exposed. The exposed capping patterns CP may be selectively removed. The removal of the capping patterns CP may define the recesses RS on the upper portion of the third interlayer dielectric layer 130. An upper portion of the liner LIN may define a side of the recess RS.

Subsequent processes may be the same as those discussed above with reference to FIGS. 8A and 8B.

Figure 15:
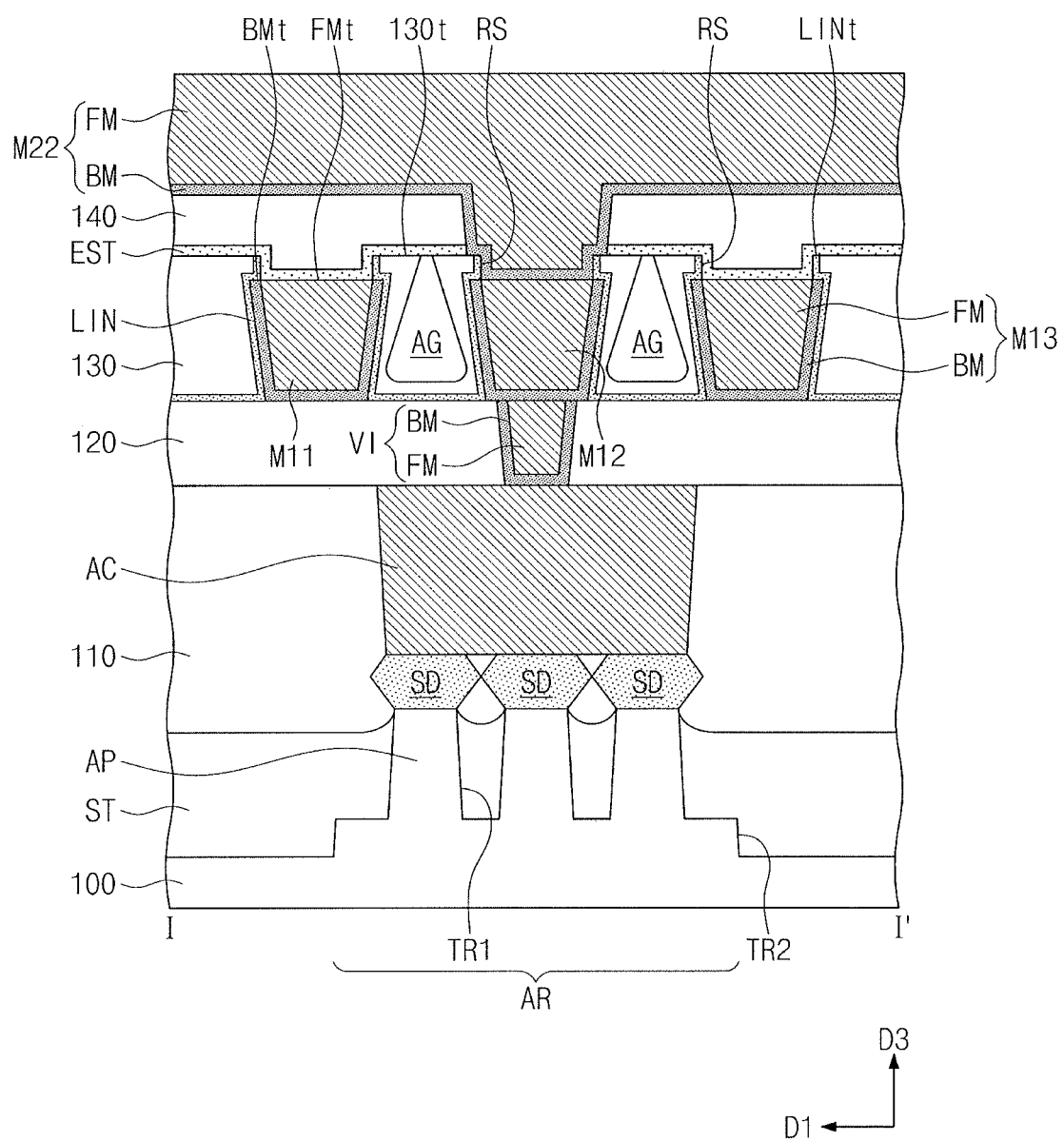
FIG. 15 illustrates a cross-sectional view along line I-I' of FIG. 1, showing a semiconductor device according to some example embodiments.

FIG. 15 illustrates a cross-sectional view taken along line I-I' of FIG. 1, showing a semiconductor device according to some example embodiments. In the embodiment that follows, a detailed description of technical features repetitive to those of the semiconductor device discussed above with reference to FIGS. 1, 2B, and 12 will be omitted, and a difference thereof will be discussed in detail.

Referring to FIGS. 1, 2B, and 15, air gaps AG may be defined in the third interlayer dielectric layer 130. The air gaps AG may be defined between the first and second lower connection lines M11 and M12 and between the second and third lower connection lines M12 and M13. Each of the air gaps AG may extend in the second direction D2 between a pair of neighboring lower connection lines M1.

A width in the first direction D1 of the air gap AG may decrease with increasing distance from the substrate 100. The air gap AG may be surrounded by the third interlayer dielectric layer 130 and the etch stop layer EST. The air gap AG may reduce a parasitic capacitance between neighboring lower connection lines M1.

Figure 16:
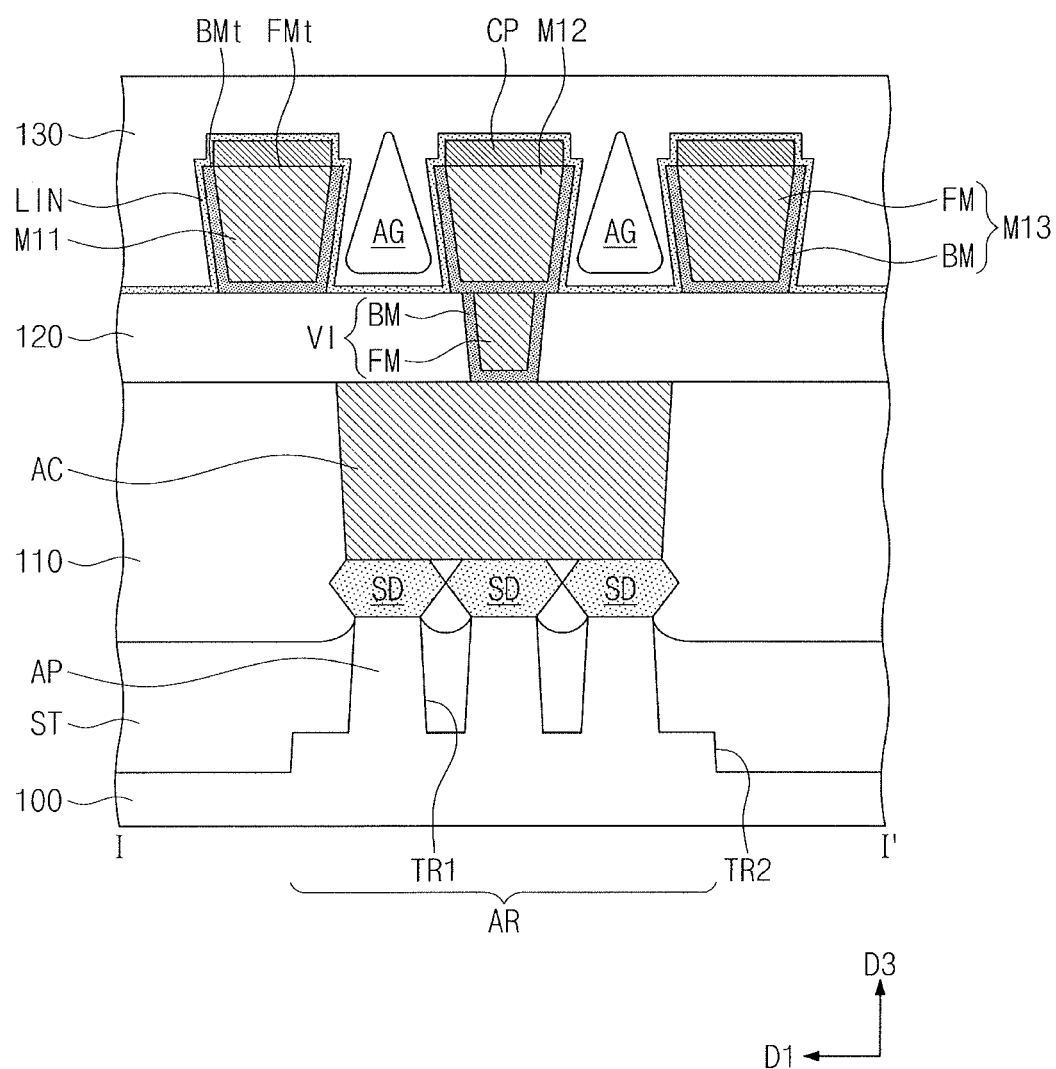
FIG. 16 illustrates a cross-sectional view along line I-I' of FIG. 1, showing a method of manufacturing a semiconductor device according to some example embodiments.

FIG. 16 illustrates a cross-sectional view taken along line I-I' of FIG. 1, showing a method of manufacturing a semiconductor device according to some example embodiments. In the embodiment that follows, a detailed description of technical features repetitive to those of the manufacturing method discussed above with reference to FIGS. 1 to 8B and FIGS. 13 and 14 will be omitted, and a difference thereof will be discussed in detail.

Referring to FIGS. 1 and 16, the third interlayer dielectric layer 130 may be formed on a resultant structure of FIG. 13. During the formation of the third interlayer dielectric layer 130, an air gap AG may be formed between a pair of neighboring lower connection lines M1.

Subsequent processes may be the same as those discussed above with reference to FIGS. 7A to 8B.

Figure 17:
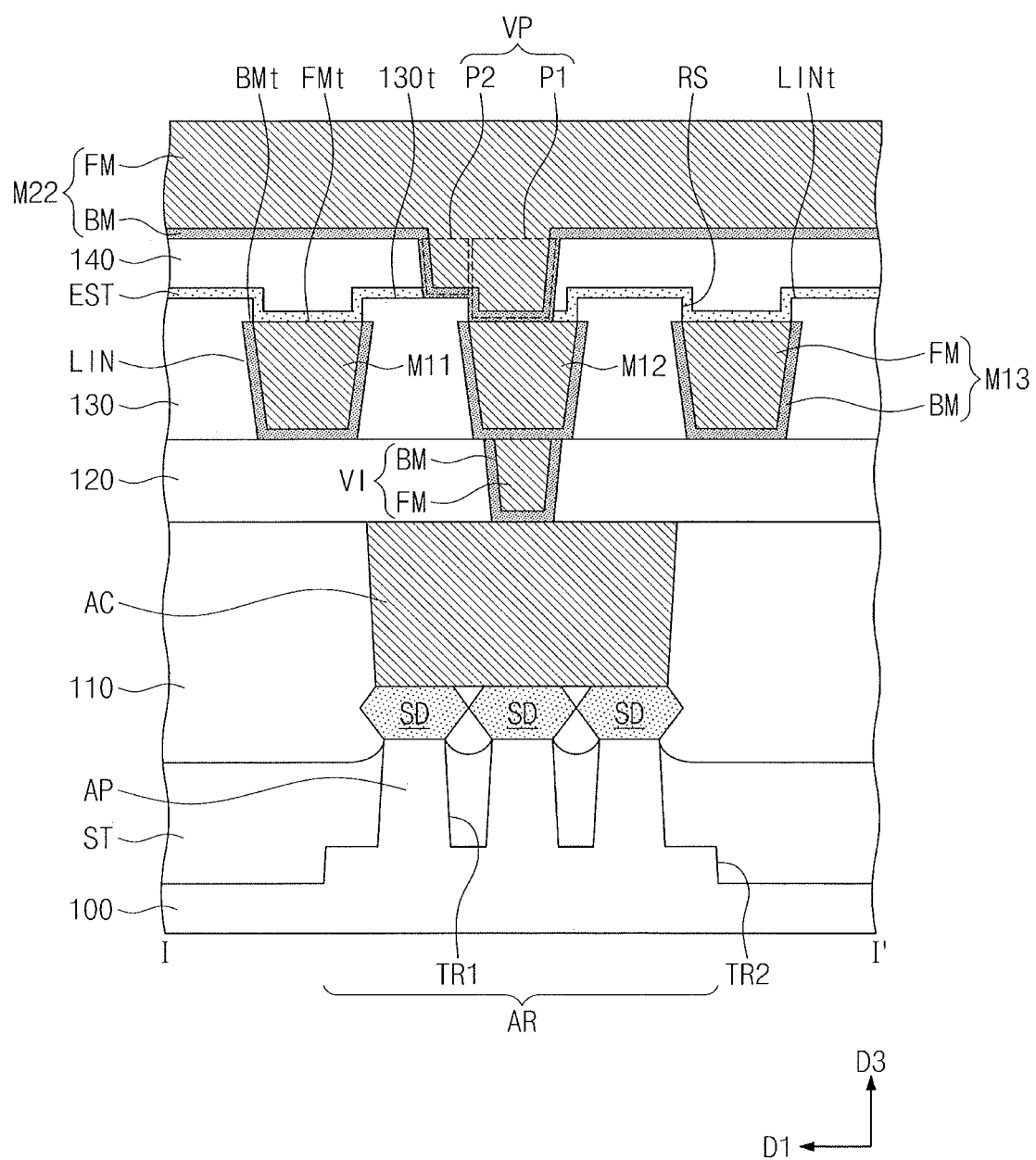
FIG. 17 illustrates a cross-sectional view along line I-I' of FIG. 1, showing a semiconductor device according to some example embodiments.

FIG. 17 illustrates a cross-sectional view taken along line I-I' of FIG. 1, showing a semiconductor device according to some example embodiments. In the embodiment that follows, a detailed description of technical features repetitive to those of the semiconductor device discussed above with reference to FIGS. 1, 2A, and 2B will be omitted, and a difference thereof will be discussed in detail.

Referring to FIGS. 1, 2B, and 17, the vertical extension part VP of the second upper connection line M22 may be offset in the first direction D1 more than the vertical extension part VP of FIG. 2A. For example, the vertical extension part VP may not be aligned with a center of the second lower connection line M12.

The second segment P2 of the vertical extension part VP may be adjacent to the first lower connection line M11. The second segment P2 of the vertical extension part VP may have a bottom surface higher than the top surface FMt of the conductive pattern FM of the first lower connection line M1, with the result that an electrical short may be avoided between the vertical extension part VP and the first lower connection line M11.

In the present embodiment, even when the vertical extension part VP of the second upper connection line M22 is misaligned with the center of the second lower connection line M12, the recess RS of the third interlayer dielectric layer 130 may prevent process defects such as an electrical short.

By way of summation and review, example embodiments provide a semiconductor device with improved electrical characteristics. Example embodiments also provide a method of manufacturing a semiconductor device, in which method process defects are avoided.

That is, according to example embodiments, the lower connection lines are provided therebetween with a damage-free dielectric layer whose dielectric constant is low, thereby reducing parasitic capacitance between the lower connection lines and improving electrical characteristics of the semiconductor device. Further, a vertical extension part of the second upper connection line may be formed in a self-aligned manner caused by the recess on the upper portion of the third interlayer dielectric layer, thereby preventing or substantially minimizing an electrical short between the vertical extension part and the first lower connection lines.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
   a substrate including a plurality of active fins;
   a device layer on the substrate and between adjacent ones of the plurality of active fins;
   at least one source/drain pattern on the plurality of active fins;
   an active contact on the at least one source/drain pattern, the active contact being connected to the at least one source/drain pattern;
   a via on the active contact, the via being electrically connected to the active contact;
   a first lower connection line and a second lower connection line above the via, the first lower connection line being connected to the via, and the second lower connection line being adjacent to the first lower connection line;
   an etch stop layer on the first and second lower connection lines;
   an upper connection line on the etch stop layer, the upper connection line being connected to the first lower connection line through a vertical extension part of the upper connection line,
   wherein the vertical extension part of the upper connection line penetrates the etch stop layer,
   wherein the etch stop layer extends from a sidewall of the vertical extension part to a top surface of the second lower connection line, and
   wherein the etch stop layer includes a stepwise structure on an edge of the top surface of the second lower connection line.

2. The semiconductor device as claimed in claim 1, wherein:
   the etch stop layer further includes a first portion on the sidewall of the vertical extension part, and a second portion on the top surface of the second lower connection line, and
   a bottom surface of the first portion is higher than a bottom surface of the second portion.

3. The semiconductor device as claimed in claim 1, wherein each of the first and second lower connection lines and the upper connection line includes a barrier pattern and a conductive pattern on the barrier pattern.

4. The semiconductor device as claimed in claim 1, further comprising a first interlayer dielectric layer on the substrate, wherein:
   the first and second lower connection lines are in the first interlayer dielectric layer,
   the first interlayer dielectric layer includes a first recess and a second recess that are on an upper portion of the first interlayer dielectric layer, the first recess exposes a top surface of the first lower connection line, the second recess exposes the top surface of the second lower connection line, the vertical extension part fills the first recess, and the etch stop layer partially fills the second recess.

5. The semiconductor device as claimed in claim 4, wherein:

the vertical extension part includes a first segment on the top surface of the first lower connection line, and a second segment on the first interlayer dielectric layer, and the first segment protrudes more than the second segment toward the substrate.

6. The semiconductor device as claimed in claim 4, wherein a top surface of the first interlayer dielectric layer is higher than the top surface of the second lower connection line.

7. The semiconductor device as claimed in claim 4, further comprising a liner between the first interlayer dielectric layer and the plurality of lower connection lines, a top surface of the liner adjacent to the second recess being higher than the top surface of the second lower connection line.

8. The semiconductor device as claimed in claim 4, wherein the first interlayer dielectric layer further includes an air gap between the first and second lower connection lines.

9. The semiconductor device as claimed in claim 1, wherein the first and second lower connection lines extend in a first direction, and the upper connection line extends in a second direction intersecting the first direction.

10. The semiconductor device as claimed in claim 1, wherein the etch stop layer covers at least a portion of the sidewall of the vertical extension part, and the etch stop layer covers at least a portion of the top surface of the second lower connection line.

11. A semiconductor device, comprising:

a substrate including a plurality of active fins;

a device layer on the substrate and between adjacent ones of the plurality of active fins;

at least one source/drain pattern on the plurality of active fins;

an active contact on the at least one source/drain pattern, the active contact being connected to the at least one source/drain pattern;

a first interlayer dielectric layer on the substrate, a top surface of the first interlayer dielectric layer being substantially coplanar with a top surface of the active contact;

a via on the active contact, the via being electrically connected to the active contact;

a second interlayer dielectric layer on the first interlayer dielectric layer;

a first lower connection line connected to the via and a second lower connection line adjacent to the first lower connection line, the first and second lower connection lines being in the second interlayer dielectric layer;

an etch stop layer on the second interlayer dielectric layer;

a third interlayer dielectric layer on the etch stop layer; and an upper connection line in the third interlayer dielectric layer, the upper connection line being connected to the first lower connection line through a vertical extension part of the upper connection line, wherein the second interlayer dielectric layer includes a first recess and a second recess that are on an upper portion of the second interlayer dielectric layer, wherein the first recess exposes a top surface of the first lower connection line, wherein the second recess exposes a top surface of the second lower connection line, wherein the vertical extension part fills the first recess, wherein the etch stop layer partially fills the second recess, and wherein the etch stop layer includes a stepwise structure formed by the second recess.

12. The semiconductor device as claimed in claim 11, wherein:

the etch stop layer further includes a first portion on a top surface of the second interlayer dielectric layer, and a second portion on the top surface of the second lower connection line, and a bottom surface of the first portion is higher than a bottom surface of the second portion.

13. The semiconductor device as claimed in claim 12, wherein the stepwise structure of the etch stop layer connects the first portion to the second portion.

14. The semiconductor device as claimed in claim 11, wherein each of the first and second lower connection lines and the upper connection line includes a barrier pattern and a conductive pattern on the barrier pattern.

15. The semiconductor device as claimed in claim 11, wherein:

the vertical extension part includes a first segment on the top surface of the first lower connection line, and a second segment on the second interlayer dielectric layer, and the first segment protrudes more than the second segment toward the substrate.

16. The semiconductor device as claimed in claim 11, wherein a top surface of the first interlayer dielectric layer is higher than the top surface of the second lower connection line.

17. The semiconductor device as claimed in claim 11, further comprising a liner between the second interlayer dielectric layer and the first and second lower connection lines, a top surface of the liner adjacent to the second recess being higher than the top surface of the second lower connection line.

18. The semiconductor device as claimed in claim 11, wherein the second interlayer dielectric layer further includes an air gap between the first and second lower connection lines.

19. The semiconductor device as claimed in claim 11, wherein the first and second lower connection lines extend in a first direction, and the upper connection line extends in a second direction intersecting the first direction.

20. The semiconductor device as claimed in claim 11, wherein the etch stop layer covers at least a portion of a sidewall of the vertical extension part, and the etch stop layer covers at least a portion of the top surface of the second lower connection line.

* * * * *